(12) United States Patent
Kawamura et al.

(10) Patent No.: US 7,176,521 B2
(45) Date of Patent: Feb. 13, 2007

(54) POWER SEMICONDUCTOR DEVICE

(75) Inventors: Keiko Kawamura, Yokohama (JP);
Noboru Matsuda, Yokohama (JP);
Yasuo Ebuchi, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 264 days.

(21) Appl. No.: 10/834,842

(22) Filed: Apr. 30, 2004

(65) Prior Publication Data
US 2005/0199953 A1 Sep. 15, 2005

(30) Foreign Application Priority Data
Mar. 10, 2004 (JP) .............................. 2004-067908

(51) Int. Cl.
*H01L 29/76* (2006.01)
(52) U.S. Cl. ...................... 257/330; 257/331; 257/332; 257/341; 257/E29.201
(58) Field of Classification Search ........ 257/330–332, 257/E29.201
See application file for complete search history.

(56) References Cited
U.S. PATENT DOCUMENTS
6,930,355 B2 * 8/2005 Matsuki et al. ............. 257/341

FOREIGN PATENT DOCUMENTS
JP 7-45817 2/1995

* cited by examiner

*Primary Examiner*—Jerome Jackson
*Assistant Examiner*—José R. Díaz
(74) *Attorney, Agent, or Firm*—Oblon, Spivak, McClelland, Maier & Neustadt, P.C.

(57) ABSTRACT

A power semiconductor device comprises a semiconductor layer; a polysilicon-containing gate; a first semiconductor region formed in said semiconductor layer at one surface of said semiconductor layer and operative to serve as at least one of a source region and an emitter region; a second semiconductor region formed in said semiconductor layer at the other surface of said semiconductor layer and operative to serve as at least one of a drain region and a collector region; a gate routing wire commonly connected to a plurality of said gates and including a polysilicon portion and a metal portion formed adjacent to it in the direction of plane of said semiconductor layer; an interlayer insulator film formed to cover said first semiconductor region, said gate routing wire and a plurality of said gates; an electrode portion formed in said interlayer insulator film and connected to said first semiconductor region; and a strap electrode plate located to cover said interlayer insulator on said gate routing wire and cover a plurality of said electrode portions and commonly connected to a plurality of said electrode portions.

19 Claims, 30 Drawing Sheets

POWER SEMICONDUCTOR DEVICE

CROSS-REFERENCE TO RELATED APPLICATIONS

This application is based upon and claims the benefit of priority from the prior Japanese Patent Application No. 2004-067908, filed on Mar. 10, 2004; the entire contents of which are incorporated herein by reference.

BACKGROUND OF THE INVENTION

1. Field of the Invention

The present invention relates to a semiconductor device such as a power MOSFET (Metal Oxide Semiconductor Field Effect Transistor).

2. Description of the Related Art

A power semiconductor device typified by a power MOSFET and an IGBT (Insulated Gate Bipolar Transistor) is a compact semiconductor element (semiconductor chip), structured to include a plurality of cells with commonly connected gates formed on a semiconductor substrate, and is capable of quick switching with a low on-resistance. It allows a large current to flow efficiently and responds to a high frequency. Accordingly, it is remarked as a part for power sources in compact electronic machines (such as personal computers and cell phones), for example.

A gate routing wire is employed to connect a plurality of gates commonly. The gate routing wire is connected to a gate electrode pad. Different structures of the gate routing wire have been proposed so that a lowered resistance of the gate routing wire can reduce power consumption in the machine. One is a double-layered structure, which includes a polysilicon film, or the same material as the gate, and an aluminum film disposed on the polysilicon film via an interlayer insulator film (JP-A-2001/36081, FIG. 1). Another is a single-layered structure of an aluminum film (JP-A-7/45817, FIGS. 1–3).

The formation of such the gate routing wire may invite a lowered yield from a short circuit between electrodes when the electrodes in the semiconductor element are electrically connected to external, resulting in a problem associated with reliability.

BRIEF SUMMARY OF THE INVENTION

According to an aspect of the present invention, there is provided a power semiconductor device comprises a semiconductor layer; polysilicon-containing gates; a first semiconductor region formed in said semiconductor layer at one surface of said semiconductor layer and operative to serve as at least one of a source region and an emitter region; a second semiconductor region formed in said semiconductor layer at the other surface of said semiconductor layer and operative to serve as at least one of a drain region and a collector region; a gate routing wire commonly connected to a plurality of said gates and including a polysilicon portion and a metal portion formed adjacent to it in the direction of plane of said semiconductor layer: an interlayer insulator film formed to cover said first semiconductor region, said gate routing wire and a plurality of said gates; electrode portions formed in said interlayer insulator film and connected to said first semiconductor region; and a strap electrode plate located to cover said interlayer insulator on said gate routing wire and cover a plurality of said electrode portions and commonly connected to a plurality of said electrode portions.

According to another aspect of the present invention, there is provided a power semiconductor device comprises a semiconductor layer; a first semiconductor region formed in said semiconductor layer at one surface of said semiconductor layer and operative to serve as at least one of a source region and an emitter region; a second semiconductor region formed in said semiconductor layer at the other surface of said semiconductor layer and operative to serve as at least one of a drain region and a collector region; an insulator film formed on said first semiconductor region; a gate formed on gate insulator film in a gate trench, said gate trench extending through said insulator film into said semiconductor layer; and a buried metal portion formed in said gate trench and stacked on said gate, wherein the bottom of said buried metal portion is located higher than the bottom of said first semiconductor region.

DETAILED DESCRIPTION OF THE INVENTION

Figure 1:
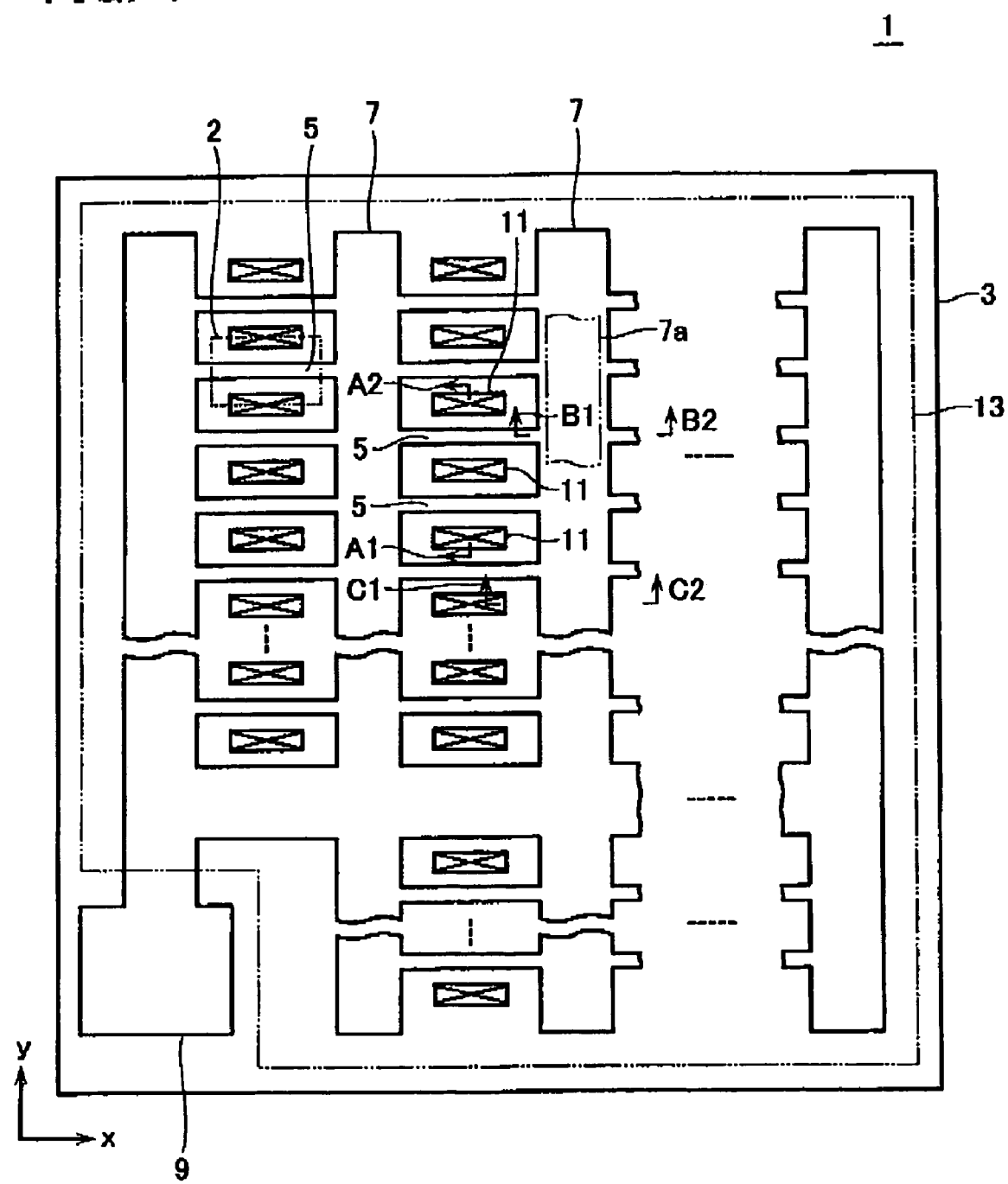
FIG. 1 is a plan view of a power semiconductor device according to a first embodiment.

In a semiconductor chip for power semiconductor devices, an electrode portion is provided in relation to a source region of each cell in a power MOSFET and to an emitter region of each cell in an IGBT. Bonding wires are widely employed to connect portions of the electrode portion to external (such as a lead frame and a substrate, on which the semiconductor chip is mounted). The bonding wires provided in relation to the portions of the electrode portion tend to increase the resistance at the connection between the electrode portion and external (the so-called package resistance).

For the purpose of lowering the package resistance, instead of the bonding wires, a strap electrode in the form of a plate may be employed and commonly connected to the portions of the electrode portion. The embodiments of the present invention are premised on the power semiconductor devices provided with such the strap electrode.

The embodiments of the present invention will be described in accordance with the items as classified below.

FIRST EMBODIMENT
    Structure of Power Semiconductor Device
    Operation of Power Semiconductor Device
    Main Effects of First Embodiment
    Method of Manufacturing Power Semiconductor Device
SECOND EMBODIMENT
    Structure of Power Semiconductor Device
    Method of Manufacturing Power Semiconductor Device
THIRD EMBODIMENT
    Structure of Power Semiconductor Device
    Method of Manufacturing Power Semiconductor Device
FOURTH EMBODIMENT
FIFTH EMBODIMENT
SIXTH EMBODIMENT
SEVENTH EMBODIMENT In the figures illustrating the embodiments, the same parts as those once explained are given the same reference numerals to omit further explanations.

First Embodiment

A power semiconductor device according to a first embodiment is a trench-gate-structured power MOSFET (U-MOS). The first embodiment is mainly characterized by a gate routing wire, which includes polysilicon portions and metal portions formed alternately adjacent thereto in a lateral plane. Although the first embodiment Is of the MOS-type in which the gate insulator film includes a silicon oxide film, the present invention is not limited to this type. For example, the present invention is also applicable to the MIS-type (Metal Insulator Semiconductor) in which the gate insulator film includes an insulator film (for example, a high dielectric film) other than the silicon oxide film.

Structure of Power Semiconductor Device

FIG. 1 is a plan view of the power semiconductor device 1 according to the first embodiment. A layout of the power semiconductor device 1 is described with reference to FIG. 1. The power semiconductor device 1 is a semiconductor chip structured to include a plurality of MOSFET cells 2 connected in parallel. The cells 2 have gates 5 formed in a semiconductor layer 3, which is composed of a silicon substrate and an epitaxial layer formed thereon. The gates 5 are commonly connected to a gate routing wire 7, which is formed on the semiconductor layer 3. In detail, the gate routing wire 7 has portions that extend in a direction (y direction), which intersects the direction (x direction) of extension of the gate 5. These portions are commonly connected to a plurality of the gates 5.

The gate routing wire 7 is connected to a gate electrode pad 9. The gates 5 are thus connected to external via the gate routing wire 7 and the gate electrode pad 9. Formed between the gates 5 is an electrode portion 11, which is to be connected to a source region. A strap electrode plate 13 is disposed over the surface of the semiconductor layer 3 except for the gate electrode pad 9. The electrode plate 13 is commonly connected to portions of the electrode portion 11 to serve as a source lead electrode.

Figure 2:
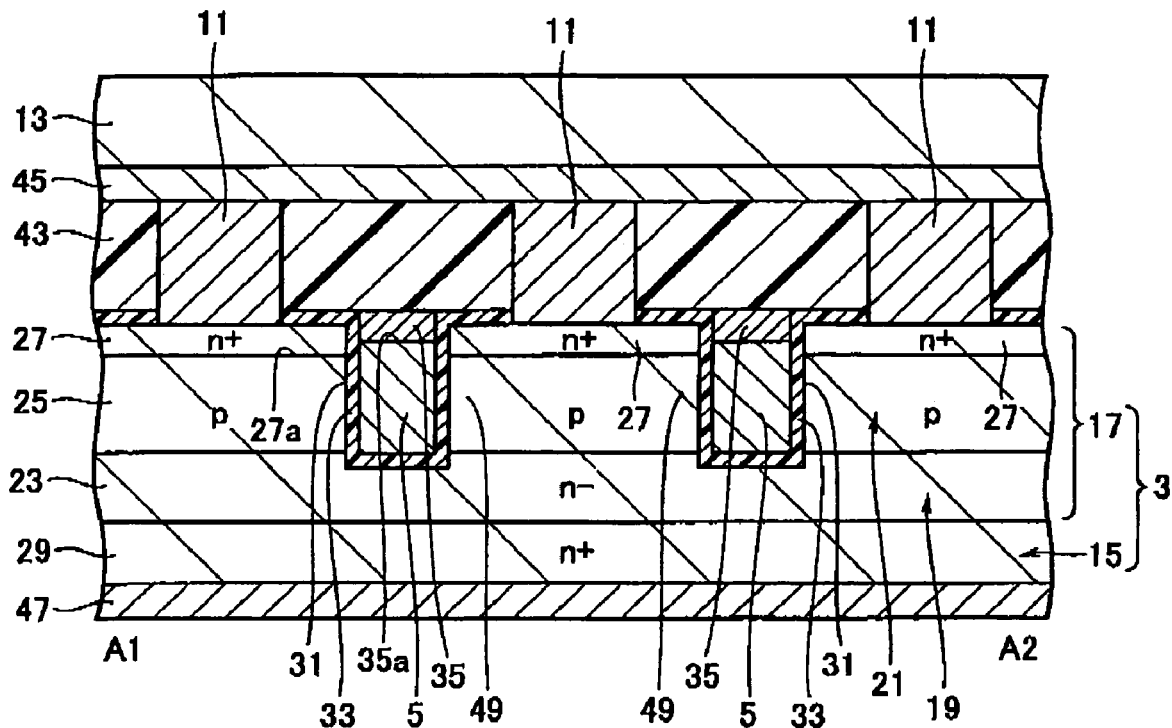
FIG. 2 is a cross-sectional view taken along A1–A2 line of FIG. 1.
Figure 3:
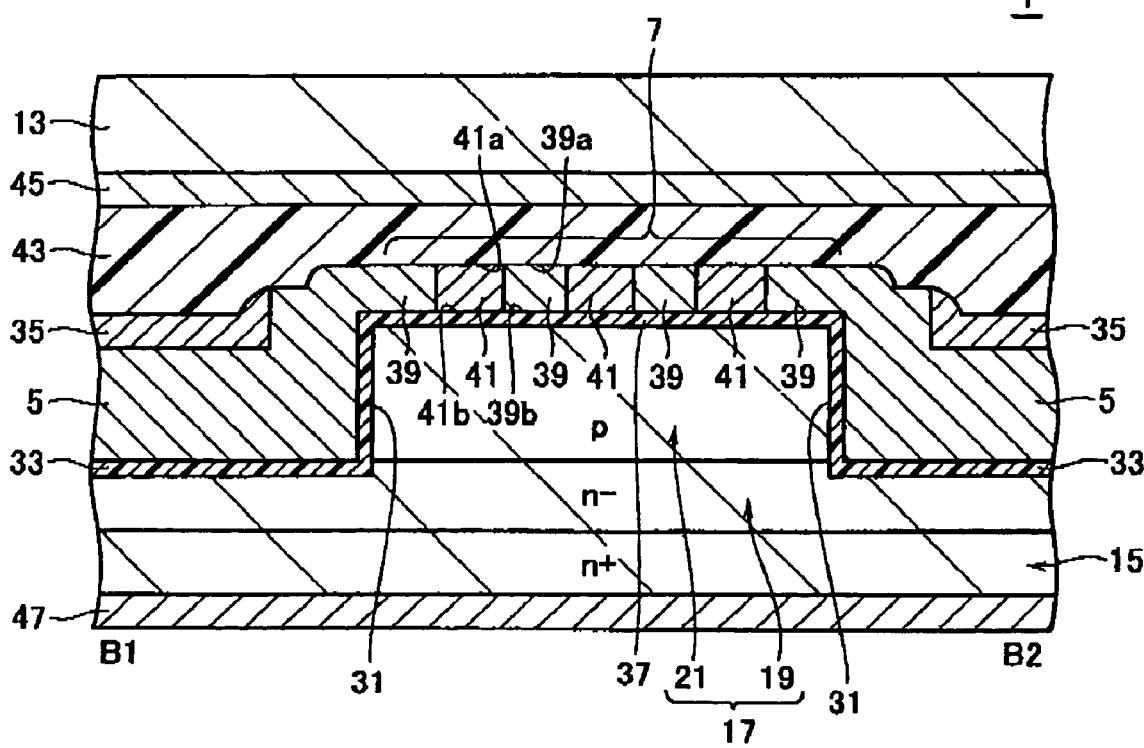
FIG. 3 is a cross-sectional view taken along B1–B2 line of FIG. 1.

Sectional structures of the power semiconductor device 1 are described with reference to FIGS. 2 and 3. FIG. 2 is a cross-sectional view taken along A1–A2 line of FIG. 1, showing a sectional structure of the MOSFET. FIG. 3 is a cross-sectional view taken along B1–B2 line of FIG. 1, showing a sectional structure of the gate routing wire. An epitaxial layer 17 is formed on an $n^+$-type silicon substrate 15 or an example of the semiconductor substrate. The layer 17 and the substrate 15 form the semiconductor layer 3. The epitaxial layer 17 contains an $n^-$-type silicon region 19 and a p-type silicon region 21 in order from below. The silicon region 21 is formed by diffusion.

In a region for forming the MOSFET shown in FIG. 2, the $n^-$-type silicon region 19 serves as a drift region 23 and the p-type silicon region 21 serves as a body region 25. An $n^+$-type source region 27 is formed in the epitaxial layer 17 above the body region 25. The $n^+$-type silicon substrate 15 serves as a drain region 29. That is to say, the source region 27 (an example of the first semiconductor region) is formed in the semiconductor layer 3 at one surface of the semiconductor layer 3, and the drain region 29 (an example of the second semiconductor region) is formed in the semiconductor layer 3 at the other surface of the semiconductor layer 3.

In the region for forming the MOSFET shown in FIG. 2, gate trenches 31 are formed in the semiconductor layer 3, as passing through the source region 27 and the body region 25 and reaching the drift region 23. A gate insulator film 33 composed of silicon oxide or ONO films is formed over the inner surface in the trench 31. A polysilicon-containing gate 5 is buried in the trench 31. Thus, the gate 5 is formed on the gate insulator film 33 in the gate trench 31 that extends from one surface of the semiconductor layer 3 into the semiconductor layer 3.

A metal portion 35 is buried in the trench 31 as stacked on and connected to the gate 5. The bottom 35a of the buried metal portion 35 is located higher than the bottom 27a of the source region 27 (an example of the first semiconductor region).

In the region for forming a gate routing wire shown in FIG. 3, the gate routing wire 7 is formed on the p-type silicon region 21 via the insulator film 37. The insulator film 37 and the gate insulator film 33 are formed at the same time. Accordingly, the insulator film 37 has the same thickness as that of the gate insulator film 33 (for example, 10–150 nm or 100–1500 angstroms).

Figure 4:
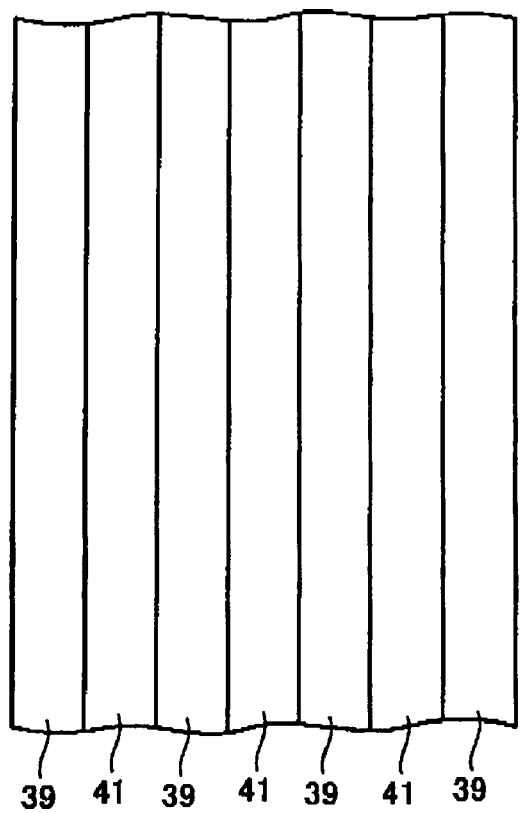
FIG. 4 is an enlarged plan view of a part 7a of a gate routing wire of FIG. 1.

The gate routing wire 7 is contiguous to or connected to the gates 5. It includes polysilicon portions 39 and metal portions 41 formed alternately adjacent thereto in a lateral plane. The upper surface 41a of the metal portion 41 and the upper surface 39a of the polysilicon portion 39 are located at the same height. The bottom 41b of the metal portion 41 and the bottom 39b of the polysilicon portion 39 are located at the same height. Exemplary materials for the metal portion 41 and the buried metal portion 35 include a metal that contains at least 90 wt. % aluminum and a metal that contains at least 90 wt. % copper. The polysilicon portions 39 and the metal portions 41 are arranged alternately. FIG. 4 is an enlarged plan view of a part 7a of the gate routing wire 7 of FIG. 1. The polysilicon portions 39 and the metal portions 41 extend along the direction of extension of the gate routing wire 7.

As shown in FIGS. 2 and 3, an interlayer insulator film 43 composed, for example, of silicon oxide is formed over the source region 27, the gate routing wire 7 and the gates 5. A plurality of the electrode portions 11 composed, for example, of aluminum are buried in the interlayer insulator film 43. Each electrode portion 11 is connected to a corresponding source region 27, respectively.

An underlay metal film 45 composed, for example, of aluminum is formed over the interlayer insulator film 43. The underlay metal film 45 is connected to a plurality of the electrode portions 11 commonly. The strap electrode plate 13 composed, for example, of copper or aluminum is mounted on the underlay metal film 45. The strap electrode plate 13 is located to cover the interlayer insulator 43 on the gate routing wire 7 and cover a plurality of the electrode portions 11 and is connected to a plurality of the electrode portions 11 commonly. An electrode 47 composed, for example, of copper (or aluminum or Ti/Ni/Au or V/Ni/Au) is mounted over the rear surface of the silicon substrate 15.

Operation of Power Semiconductor Device

Operation of the power semiconductor device 1 is described with reference to FIGS. 1–3. In operation, as the source region 27 is grounded, the strap electrode plate 13 is also grounded. A certain positive voltage is applied to the drain region 29 via the electrode 47.

In operation to turn on the power semiconductor device 1, a certain positive voltage is applied to each of the gates 5 via the gate electrode pad 9 and the gate routing wire 7. As a result, an n-type inverted layer appears in a region (a channel region 49) in the vicinity of the gate 5 and opposite to the gate 5 within the body region 25. Electrons injected from the source region 27 through the inverted layer into the drift region 23 reach the drain region 29. Thus, current flows from the drain region 29 to the source region 27 accordingly.

In operation to turn off the power semiconductor device 1, to the contrary, the voltage applied to the gate 5 is controlled to lower the potential on the gate 5 below that on the source region 27. As a result, the n-type inverted layer disappears from the channel region 49 and halts the injection of electrons from the source region 27 into the drift region 23. Thus, no current flows from the drain region 29 to the source region 27.

Main Effects of First Embodiment

Figure 5:
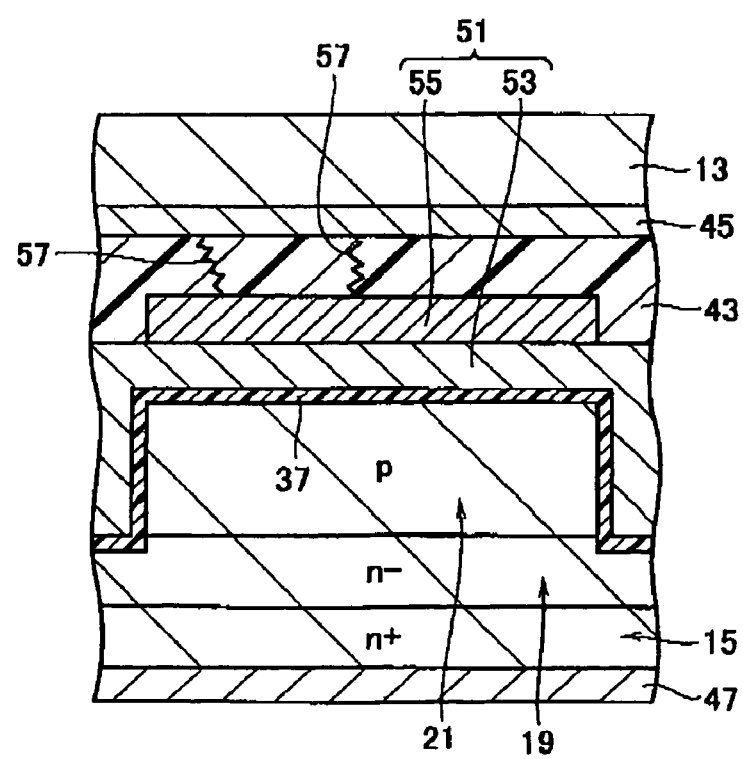
FIG. 5 is a cross-sectional view of a gate routing wire according to a comparative example.

Effect I:

Effect I of the first embodiment is described in comparison with a comparative example. FIG. 5 is a cross-sectional view of a gate routing wire 51 according to the comparative example and corresponds to FIG. 3. The gate routing wire 51 has a double-layered structure that includes a polysilicon film 53 and an aluminum film 55 disposed thereon.

In the structure of the comparative example, cracks 57 may occur possibly in the interlayer insulator film 43 located above the gate routing wire 51. A detailed discussion is given below. The strap electrode plate 13 can be fixed on the underlay metal film 45 when heat or ultrasonic is applied to the strap electrode plate 13 while the strap electrode plate 13 is pressed against the underlay metal film 45. In a word, the strap electrode plate 13 is commonly connected by crimping to a plurality of the electrode portions 11 in FIG. 2.

As the aluminum film is soft and deformable, portions projected from the aluminum film 55 similarly behave as cavities and provide no support for the interlayer insulator film 43 above the aluminum film 55. Therefore, when the strap electrode plate 13 is pressed against the underlay metal film 45, the cracks 57 can occur in the interlayer insulator film 43. The crack 57 may cause a gate-source short, lowering reliability of the power semiconductor device and worsening the yield.

Even if the gate routing wire 51 has a single-layered structure of the aluminum film 55, the aluminum film 55 has a portion that is patterned in the direction intersecting the gate and employed as the gate routing wire 51. The portion is also projected, and the same problem arises accordingly.

If the gate routing wire 51 is composed only of the polysilicon film 53, the cracks 57 can be prevented from occurring because the polysilicon film is relatively hard. This configuration, however, elevates the resistance of the gate routing wire 51 and accordingly increases the power consumption in the power semiconductor device.

The gate routing wire 7 in the power semiconductor device 1 according to the first embodiment shown in FIG. 3 is structured to include the polysilicon portions 39 and the metal portions 41 formed alternately adjacent thereto in a lateral plane. (In other words, the gate routing wire 7 is structured to include the polysilicon portions 39 and the metal portions 41 formed in the same layer). The metal portions 41 composed mainly of aluminum or copper can achieve a lowered resistance of the gate routing wire 7. As the metal portions 41 and the polysilicon portions 39 are located at the same height, the polysilicon portions 39 can support the interlayer insulator film 43 above the gate routing wire 7. Accordingly, it is possible to prevent any cracks from occurring in the interlayer insulator film 43 above the gate routing wire 7 when the strap electrode plate 13 is pressed against the underlay metal film 45. Thus, the first embodiment can provide a power semiconductor device with a lowered power consumption, improved yield and high reliability.

Effect II:

In the first embodiment, the buried metal portion 35 is formed on the gate 5 as shown in FIG. 2. Thus, the trench gate buried in the gate trench 31 has a double-layered structure composed of the gate 5 and the buried metal portion 35. The buried metal portion 35 can achieve a lowered resistance of the trench gate.

Effect III:

In the first embodiment, as the bottom 35a of the buried metal portion 35 is located higher than the bottom 27a of the source region 27, the buried metal portion 35 is configured not to face the channel region 49. Part of the channel region 49 faces the buried metal portion 35 and the remainder faces the gate 5 in another structure (a structure opposite to the buried metal portion and the gate). In comparison with such the structure, it is possible to suppress fluctuations in threshold of the MOSFET. In addition, it is also possible to avoid the metal from contaminating the gate insulator film 33 on the surface of the channel region 49. This is effective to form a more preferable inverted layer for the channel region 49. The structure opposite to the buried metal portion and the gate, as well as a structure that fills the gate trench 31 with not the buried metal portion 35 but only the gate 5, can be contained in the embodiments of the present invention.

Effect IV:

As shown in FIG. 4, the metal portions 41 according to the first embodiment extend along the direction of extension of the gate routing wire 7. Thus, the metal portions 41 extend along the direction of the current flowing in the gate routing wire 7. Accordingly, the current can easily flow in the gate routing wire 7 (or the resistance of the gate routing wire 7 can be lowered).

Method of Manufacturing Power Semiconductor Device

A method of manufacturing the semiconductor device according to the first embodiment is described with reference to FIGS. 2, 3 and 6–21. Among FIGS. 6–21, those showing A1–A2 sections (the region for forming the MOSFET) correspond to FIG. 2 and those showing B1–B2 sections (the region for forming the gate routing wire) correspond to FIG. 3.

Figure 6:
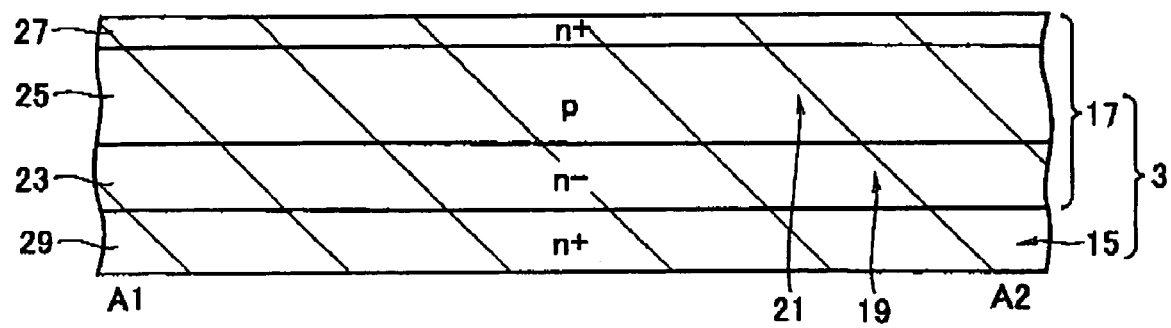
FIG. 6 is a process diagram of a first step in a method of manufacturing the power semiconductor device according to the first embodiment (A1–A2 section)
Figure 7:
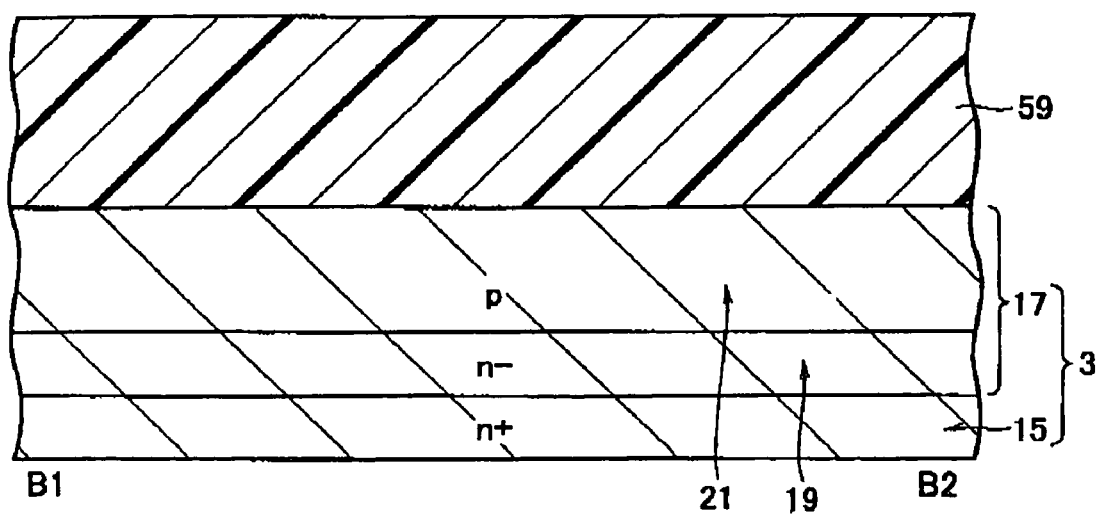
FIG. 7 is a process diagram of the first stop in the method (B1–B2 section)

As shown in FIGS. 6 and 7, a preparation is made for the $n^+$-type silicon substrate 15 that has the epitaxial layer 17 formed thereon. The silicon substrate 15 and the epitaxial layer 17 configure the semiconductor layer 3. In the region for forming the MOSFET (FIG. 6), the $n^+$-type silicon substrate 15 serves as the drain region 29 (an example of the second semiconductor region).

The region for forming the MOSFET (FIG. 6) is exposed and a resist 59 is formed to cover the region for forming the gate routing wire (FIG. 7). The resist 59 is employed as a mask for injecting n-type ions into the surface layer of the p-type silicon region 21 to form the $n^+$-type source region 27 (an example of the first semiconductor region) in the surface layer of the p-type silicon region 21. Thereafter, the resist 59 is removed.

Figure 8:
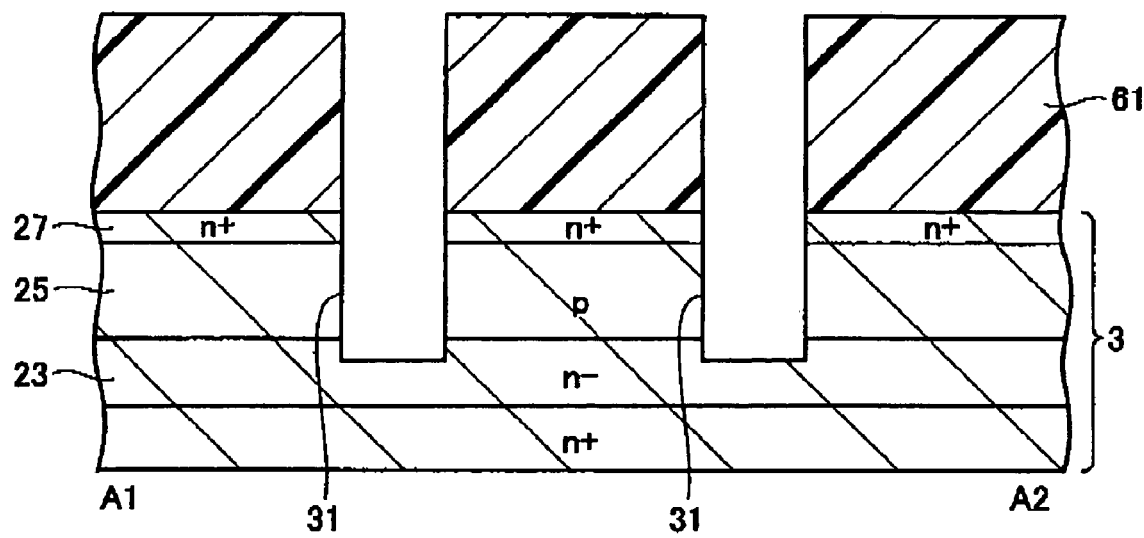
FIG. 8 is a process diagram of a second step in the method (A1–A2 section)
Figure 9:
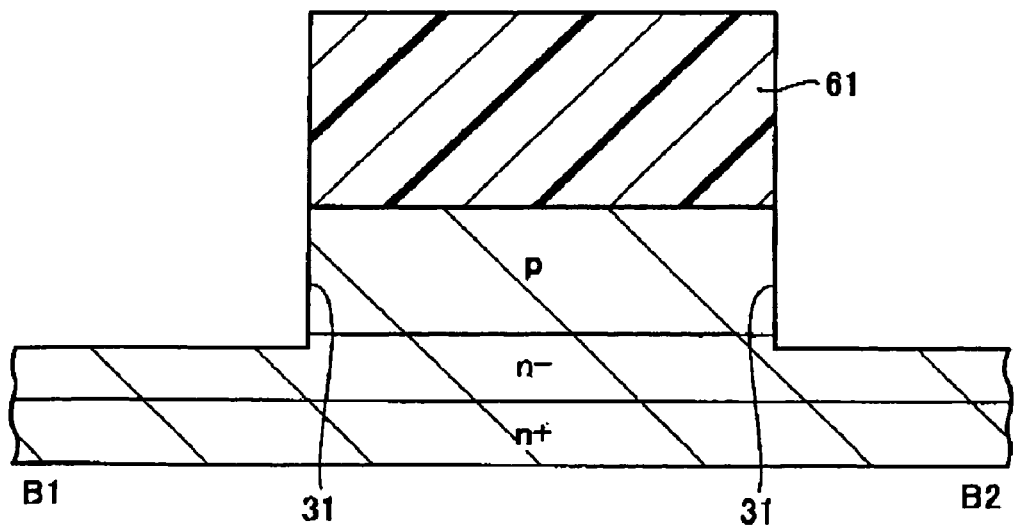
FIG. 9 is a process diagram of the second step in the method (B1–B2 section)

As shown in FIGS. 8 and 9, a resist 61 is formed on the semiconductor layer 3. The resist 61 has apertures each corresponding to the region for forming the gate trench. $SiO_2$ film or SiN film (not shown) is formed between the resist 61 and the semiconductor layer 3. The resist 61 is employed as a mask for applying an anisotropic etching to the $SiO_2$ film or SiN film. After removing the resist 61, the $SiO_2$ film or SiN film is employed as a mask for applying an anisotropic etching to the source region 27 and the body region 25 to form the gate trenches 31 in the semiconductor layer 3, as passing through the source region 27 and the body region 25 and reaching the drift region 23.

Figure 10:
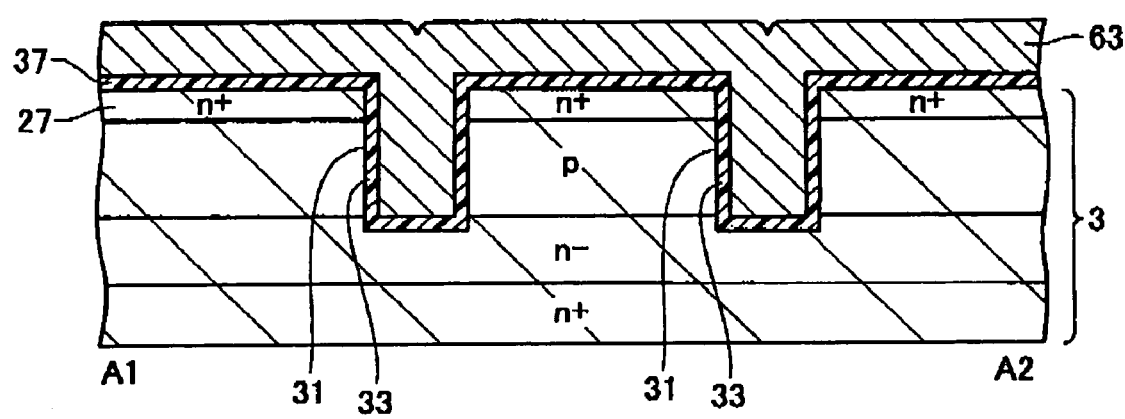
FIG. 10 is a process diagram of a third step in the method (A1–A2 section)
Figure 11:
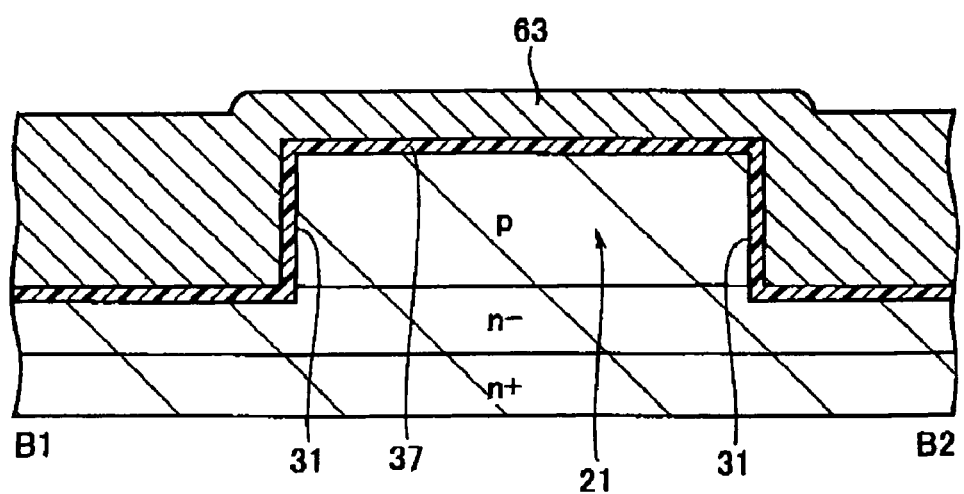
FIG. 11 is a process diagram of the third step in the method (B1–B2 section)

As shown in FIGS. 10 and 11, thermal oxidation is performed to form the gate insulator film 33 on the inner surface in the gate trench 31, and the insulator film 37 on the source region 27 and the p-type silicon region 21. The gate insulator film 33 and the insulator film 37 are composed of silicon oxide. Then, CVD (Chemical Vapor Deposition) is employed to form a polysilicon film 63 over one surface of the semiconductor layer 3. The gate trench 31 is filled with the polysilicon film 63. The polysilicon film 63 serves as the gates and the gate routing wire commonly connected thereto.

Figure 12:
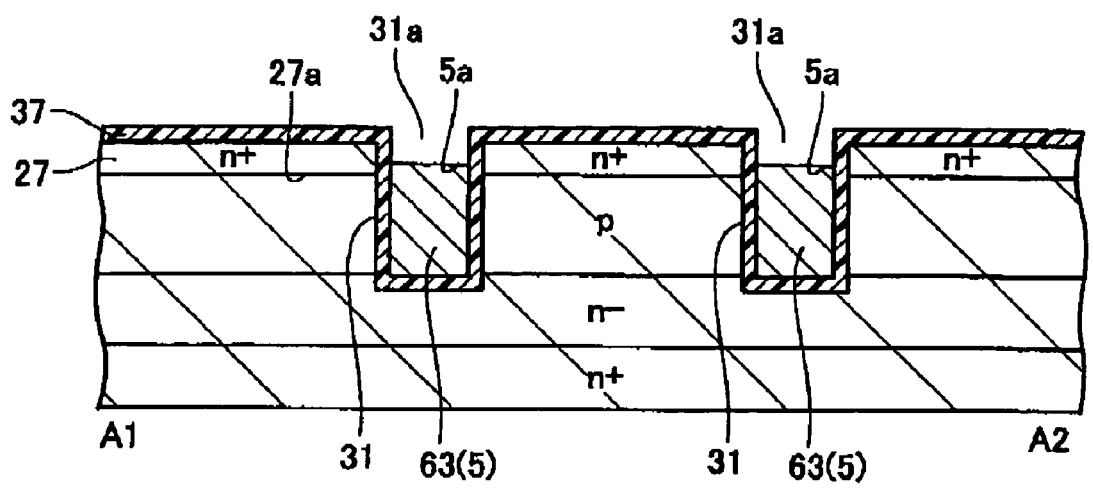
FIG. 12 is a process diagram of a fourth step in the method (A1–A2 section)
Figure 13:
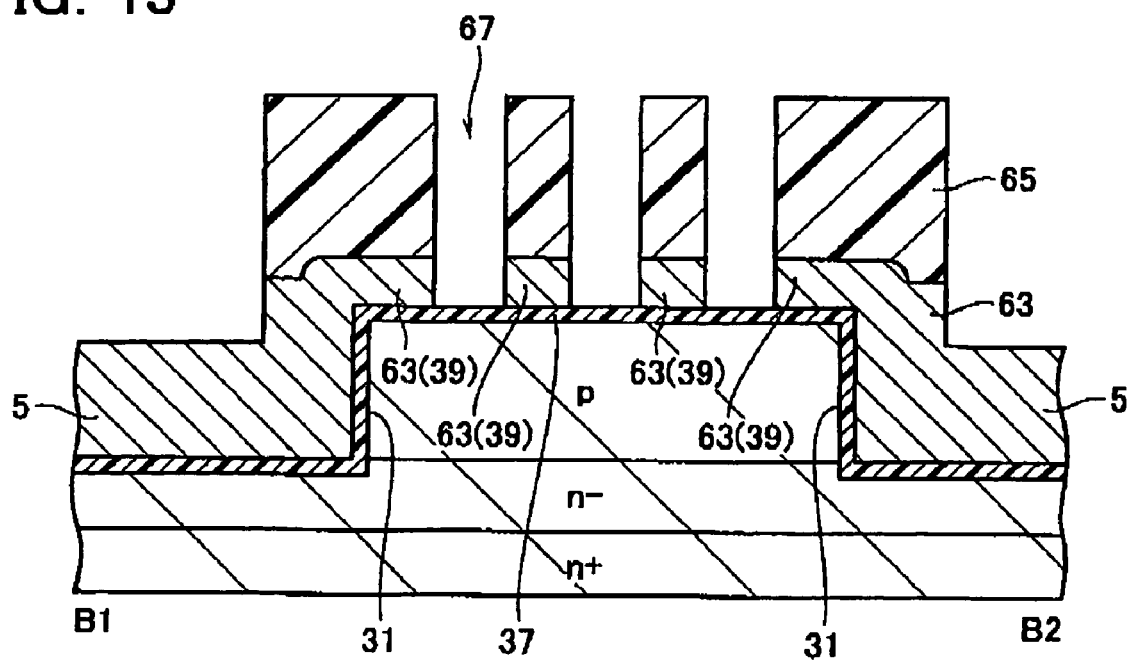
FIG. 13 is a process diagram of the fourth step in the method (B1–B2 section)

As shown in FIGS. 12 and 13, the polysilicon film 63 located in the region for forming the MOSFET (FIG. 12) is exposed. In addition, a resist 65 having certain apertures 67 is formed on the polysilicon film 63 located in the region for forming the gate routing wire (FIG. 13). The apertures 67 correspond to the regions for forming the metal portions of the gate routing wire. The resist 65 is an example of the mask pattern that partly covers the polysilicon film 63 located in the region for forming the gate routing wire.

The resist 65 (an example of the mask pattern) is employed as a mask and the insulator film 37 as an etching stopper for selectively applying an anisotropic etching to the polysilicon film 63 to form the gate 5 in the gate trench 31 and form the polysilicon portions 39 of the gate routing wire. The upper surface 5a of the gate 5 is located higher than the bottom 27a of the source region 27 (an example of the first semiconductor region) and lower than an entrance 31a of the gate trench 31. The polysilicon portions 39 are partly formed in the region for forming the gate routing wire. Then, the resist 65 is removed.

Figure 14:
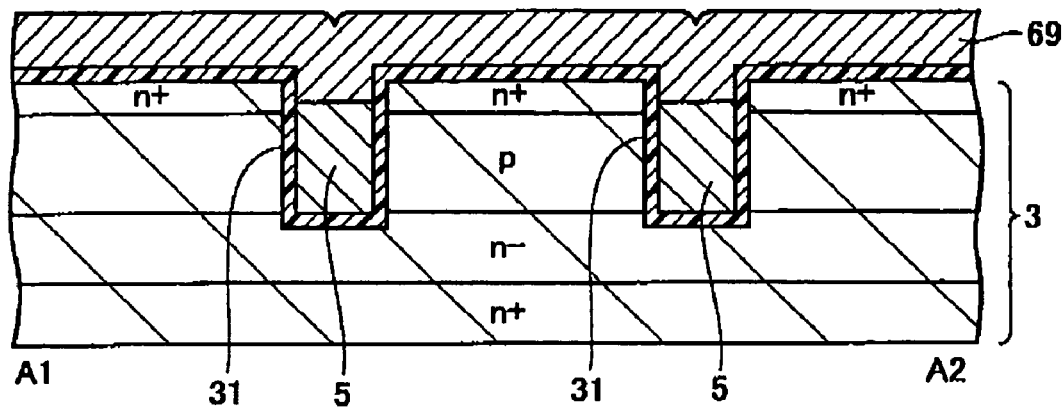
FIG. 14 is a process diagram of a fifth step in the method (A1–A2 section)
Figure 15:
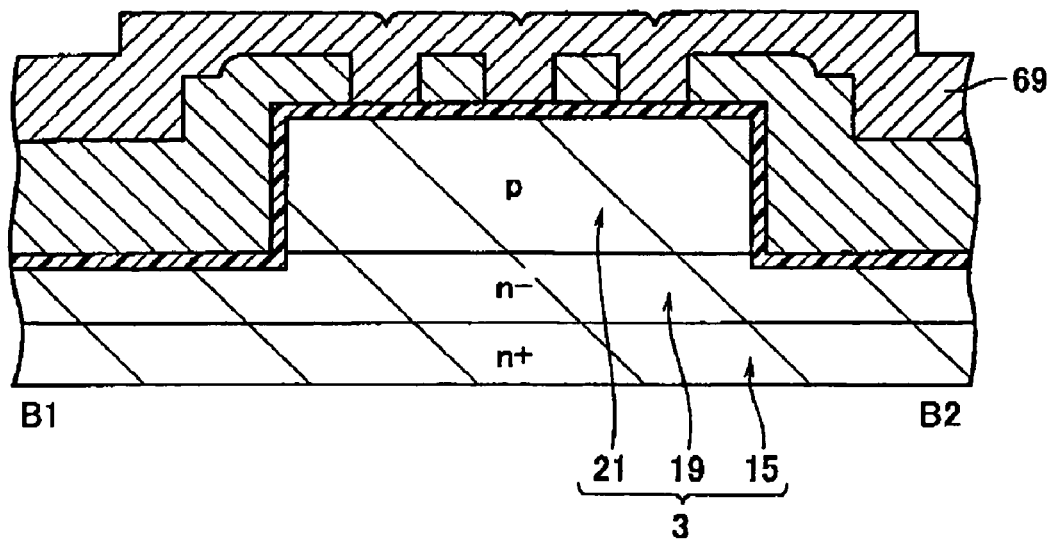
FIG. 15 is a process diagram of the fifth step in the method (B1–B2 section)

As shown in FIGS. 14 and 15, a metal film 69 composed of aluminum or copper is formed over one surface of the semiconductor 3 by sputtering, for example, to fill the gate trench 31 above the gate 5 with the metal film 69.

Figure 16:
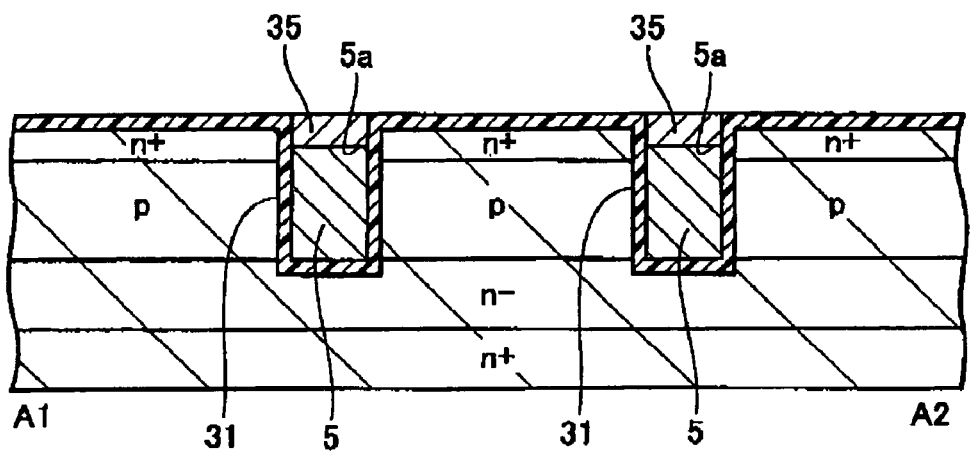
FIG. 16 is a process diagram of a sixth step in the method (A1–A2 section)
Figure 17:
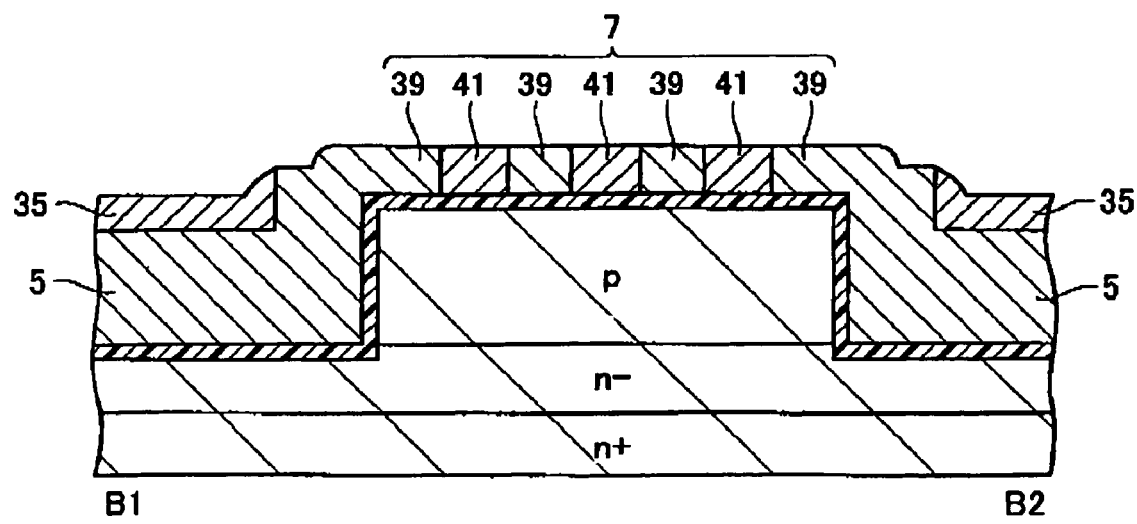
FIG. 17 is a process diagram of the sixth step in the method (B1–B2 section)

As shown in FIGS. 16 and 17, the metal film 69 is etched back (as an example of selective removal). This process forms the buried metal film 35 in a space between the upper surface 5a of the gate 5 and the entrance 31a of the gate trench (FIG. 12) and forms each of the metal portions 41 in a space between the polysilicon portions 39. In other words, it forms the buried metal film 35 located on the gate 5 in the gate trench 31 and forms the metal portions 41 of the gate routing wire 7 in the remaining portions of the region for forming the gate routing wire. A technology of CMP (Chemical Mechanical Polishing) may be employed for selective removal of the metal film 69.

Figure 18:
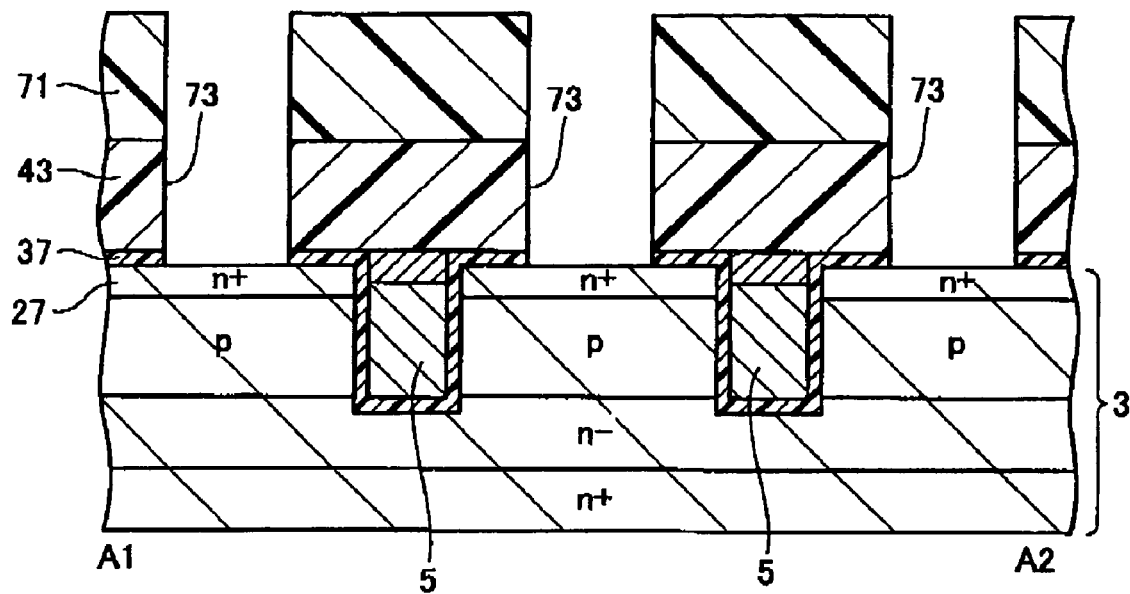
FIG. 18 is a process diagram of a seventh step in the method (A1–A2 section)
Figure 19:
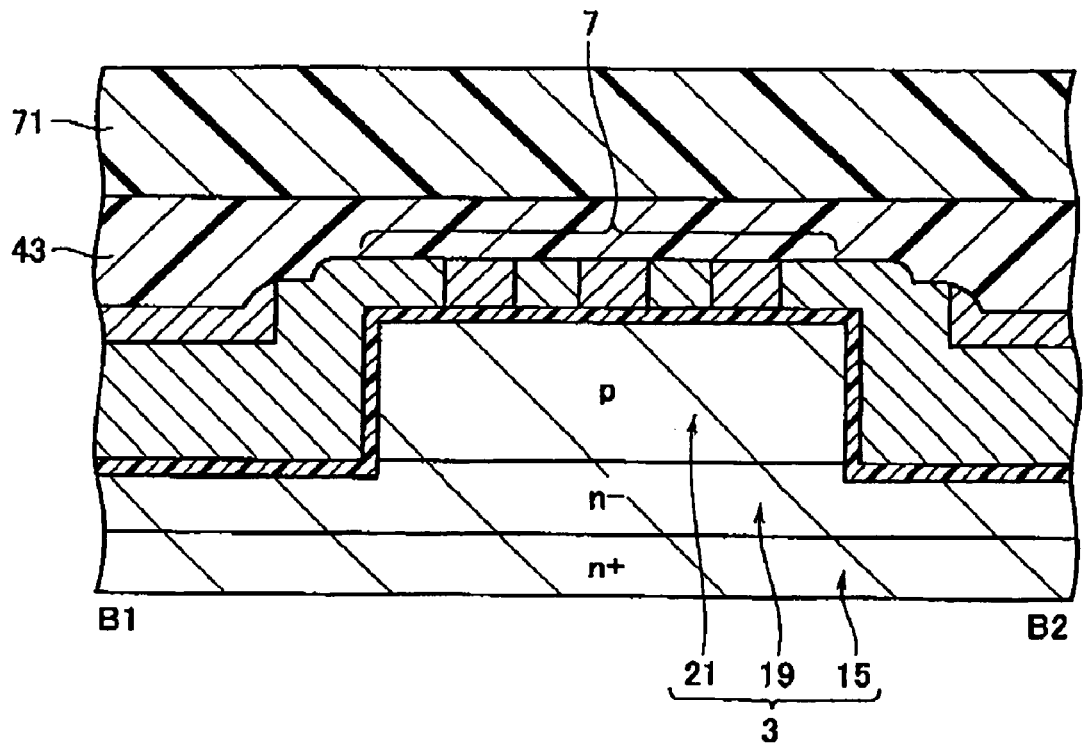
FIG. 19 is a process diagram of the seventh step in the method (B1–B2 section)

As shown in FIGS. 18 and 19, the interlayer insulator film 43 composed of silicon oxide is formed by CVD, for example, over one surface of the semiconductor layer 3 to cover the gate routing wire 7 and the gates 5 with the interlayer insulator film 43. A resist 71 having apertures each located between the gates 5 is formed on the interlayer insulator film 43. The resist 71 is employed as a mask for removing the interlayer insulator film 43 and the insulator film 37 selectively by anisotropic etching to form contact holes 73 that reach the source region 27. Then, the resist 71 is removed.

Figure 20:
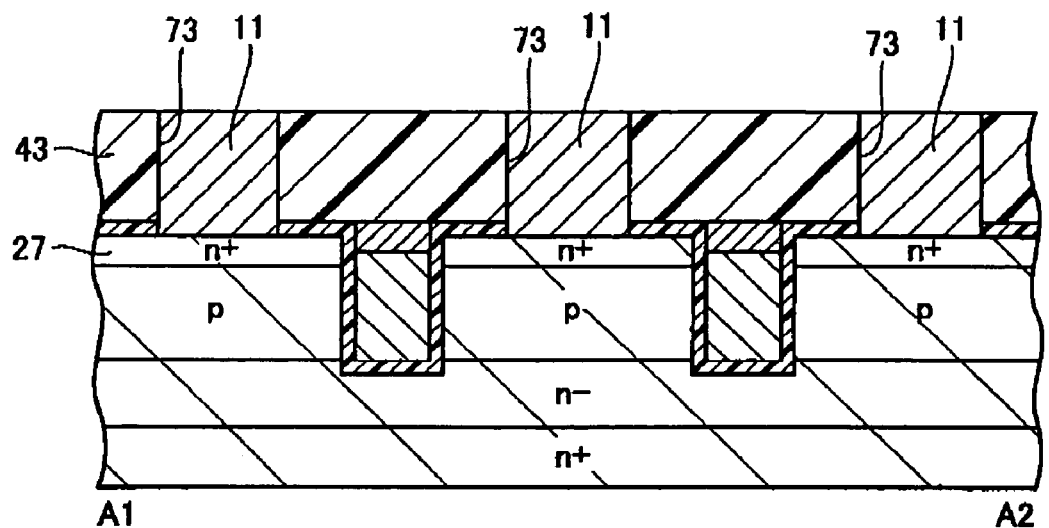
FIG. 20 is a process diagram of an eighth step in the method (A1–A2 section)
Figure 21:
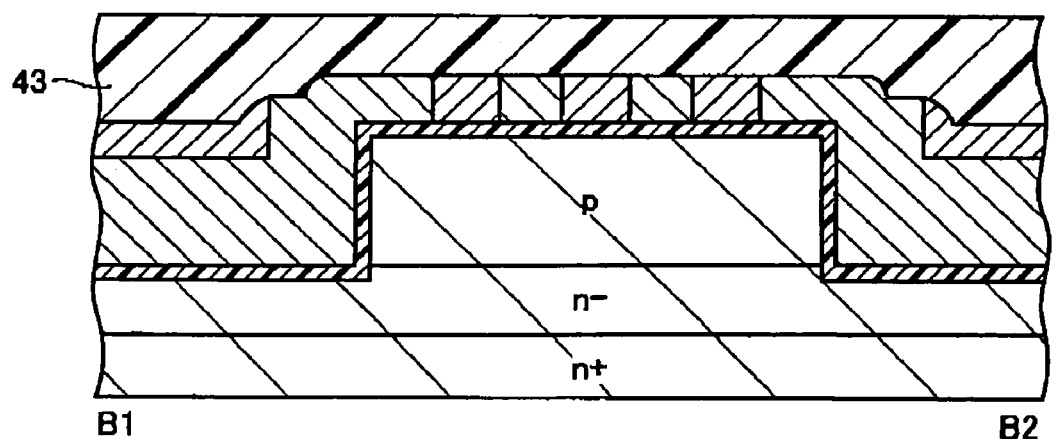
FIG. 21 is a process diagram of the eighth step in the method (B1–B2 section)

As shown In FIGS. 20 and 21, sputtering is applied, for example, to form an aluminum film serving as the electrode portion 11 and the underlay metal film 45 on the interlayer insulator film 43 to fill the contact holes 73. The aluminum film is patterned to form the electrode portion 11 in the contact holes 73 and the underlay metal film 45. As a result, the electrode portion 11 is formed in the interlayer insulator film 43 and connected to the source region 27.

As shown in FIGS. 2 and 3, the underlay metal film 45 is commonly connected to a plurality of the electrode portions 11. The strap electrode plate 13 is disposed on the underlay metal film 45. As a result, the strap electrode plate 13 is disposed to cover the interlayer insulator film 43 above the gate routing wire 7 and cover the portions of the electrode portion 11.

The strap electrode plate 13 is then commonly connected by crimping to a plurality of the electrode portions 11. In detail, the strap electrode plate 13 can be attached onto the underlay metal film 45 when heat or ultrasonic is applied to the strap electrode plate 13 while the strap electrode plate 13 is pressed against the underlay metal film 45.

The first embodiment is provided with the gate routing wire 7 that is structured as shown in FIG. 3. Therefore, any cracks can be prevented from occurring in the interlayer insulator film 43 on the gate routing wire 7 when the strap electrode plate 13 Is pressed against the underlay metal film 45.

Second Embodiment

Structure of Power Semiconductor Device

Figure 22:
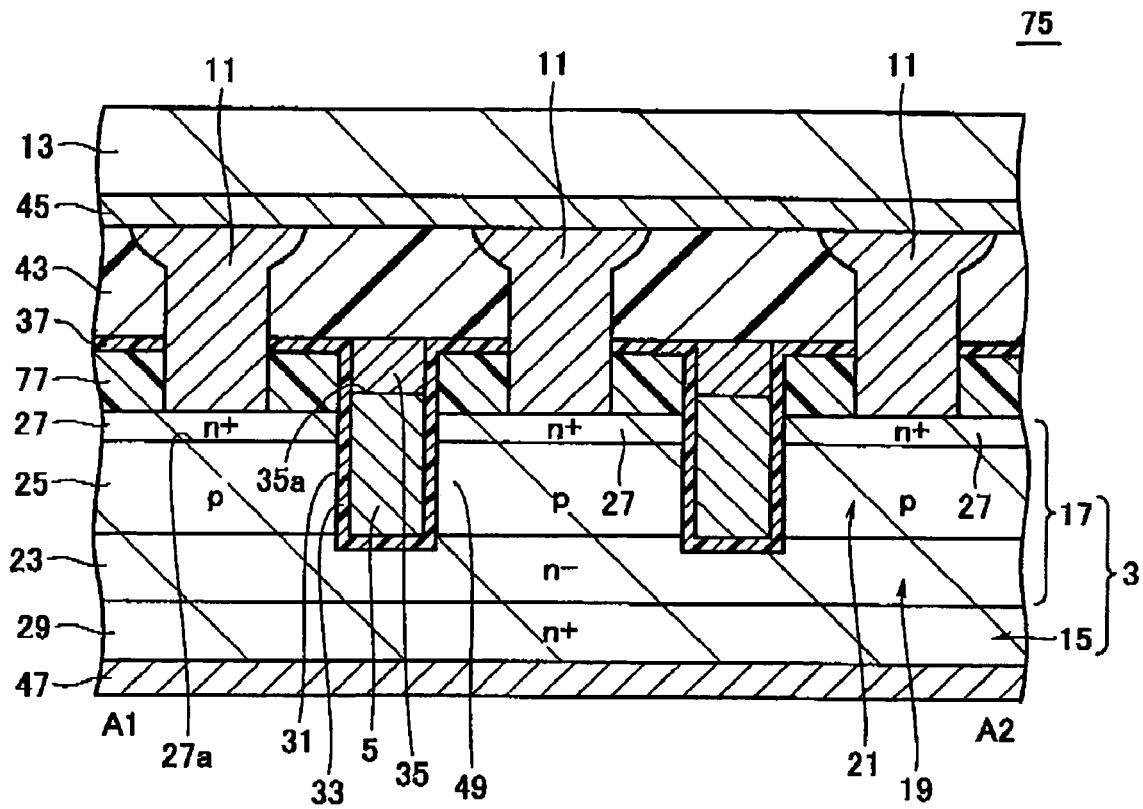
FIG. 22 shows a sectional structure of a MOSFET provided in a power semiconductor device according to a second embodiment.

FIG. 22 shows a sectional structure of a MOSFET provided in a power semiconductor device 75 according to a second embodiment and corresponds to FIG. 2. The second embodiment mainly differs from the first embodiment in an intermediate insulator film 77 (for example, a silicon oxide film) formed between one surface of the semiconductor layer 3 and the interlayer insulator film 43. The second embodiment is described below mainly concentrating on differences from the first embodiment.

The intermediate insulator film 77 has a thickness of 100–1000 nm (1000–10000 angstroms), for example, which is larger than that of the gate insulator film 33. The insulator film 37 is formed between the intermediate insulator film 77 and the interlayer insulator film 43. The insulator film 37 and the gate insulator film 33 are formed at the same time. The gate trenches 31 pass through the intermediate insulator film 77, the source region 27 and the body region 25 and reach the drift region 23. The buried metal film 35 is formed in the intermediate insulator film 77 as stacked on and connected to the gate 5. The bottom 35a of the buried metal film 35 is located higher than the bottom 27a of the source region 27.

As the second embodiment is provided with the intermediate insulator film 77, it can increase the thickness of the buried metal film 35 more than the first embodiment. Therefore, in the trench gate consisting of the gate 5 and the buried metal film 35, as the second embodiment can increase the ratio of the buried metal film 35 more than the first embodiment, it can lower the resistance of the trench gate.

The bottom 35a of the buried metal film 35 in FIG. 22 is located higher than the source region 27. As described earlier in Effect III of Main Effects of First Embodiment, it is sufficient if the bottom 35a of the buried metal film 35 is located higher than the bottom 27a of the source region 27.

In the second embodiment the entrance of the gate trench 31 is located on the upper surface of the intermediate insulator film 77 formed on the source region 27. Accordingly, controlling the extent of etching of the gate 5 in the gate trench 31 reliably structures the bottom 35a of the buried metal film 35 located higher than the bottom 27a of the source region 27.

The structure of the region for forming the gate routing wire according to the second embodiment is same as that of the first embodiment shown in FIG. 3. Accordingly, in the second embodiment the intermediate insulator film 77 is removed from below the gate routing wire 7. This removal can suppress the source-drain through current to improve the performance of the power semiconductor device 75.

Figure 23:
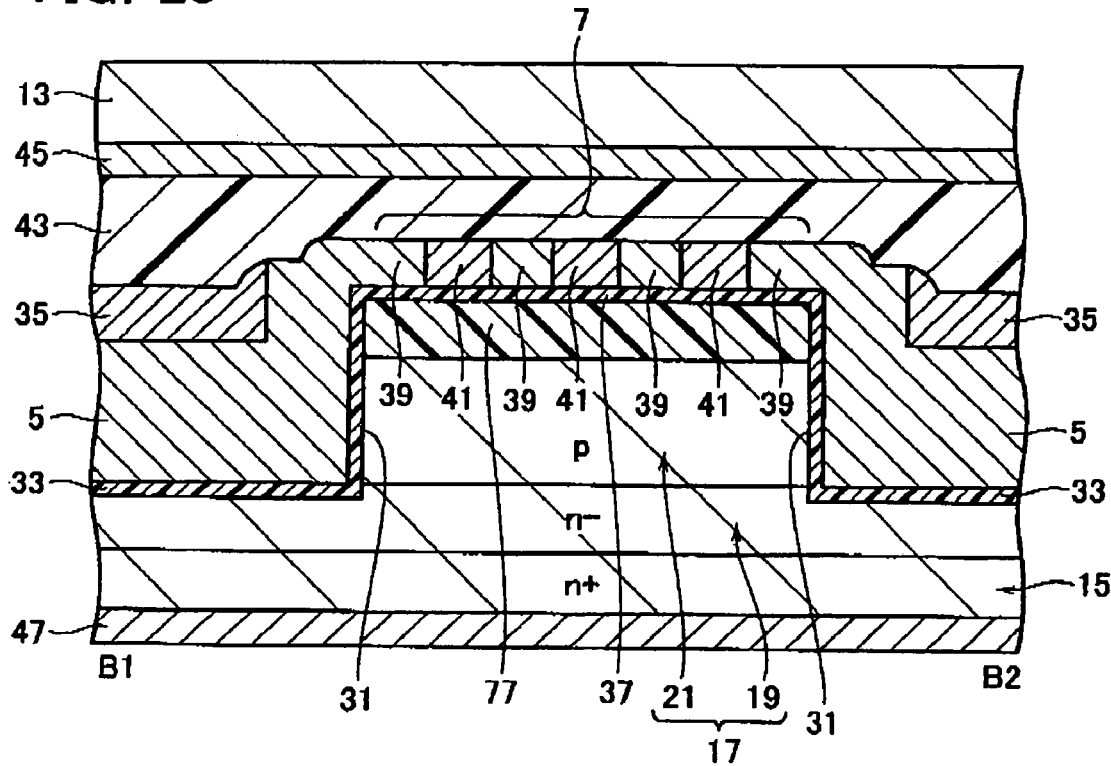
FIG. 23 is a cross-sectional view showing an alternative of a region for forming a gate routing wire according to the second embodiment.

In one embodiment of the present invention, the intermediate insulator film 77 is structured to remain below the gate routing wire 7. FIG. 23 is a cross-sectional view showing this structure. The presence of the intermediate insulator film 77 increases the process margin at the time of forming the polysilicon portions 39, which prevents an occurrence of leakage between the gate routing wire 7 and the p-type silicon region 21.

Method of Manufacturing Power Semiconductor Device

Figure 24:
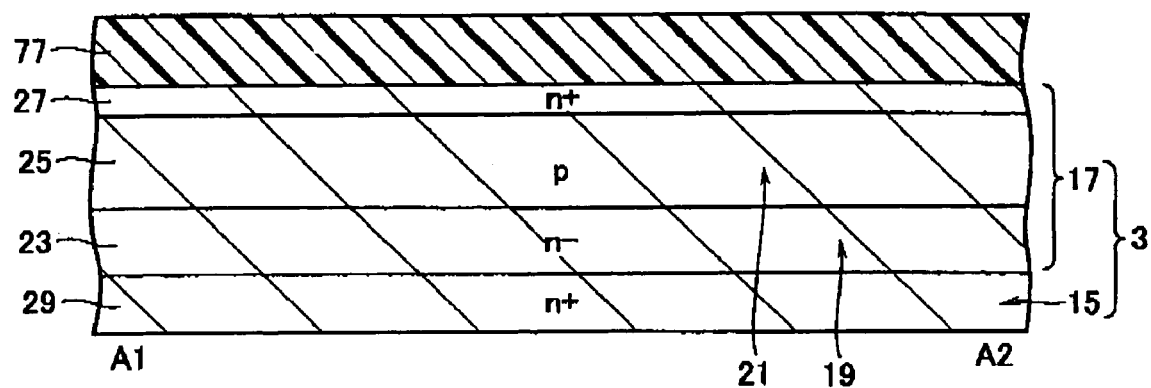
FIG. 24 is a process diagram of a first step in a method of manufacturing the power semiconductor device according to the second embodiment (A1–A2 section)
Figure 25:
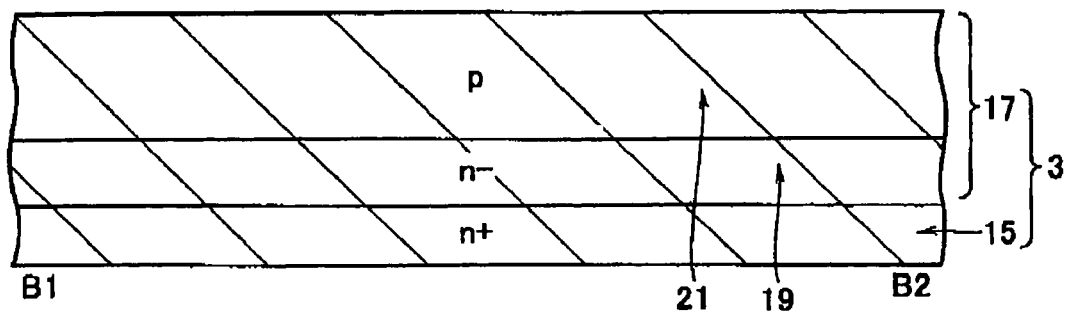
FIG. 25 is a process diagram of the first step in the method (B1–B2 section)

A method of manufacturing the power semiconductor device 75 according to the second embodiment is described concentrating on differences from that of the first embodiment. After the process steps shown in FIGS. 6 and 7, the intermediate insulator film 77 is formed on the semiconductor layer 3 composed of silicon oxide by CVD, for example, as shown in FIGS. 24 and 25. The intermediate insulator film 77 has a larger thickness than the gate insulator film.

Figure 26:
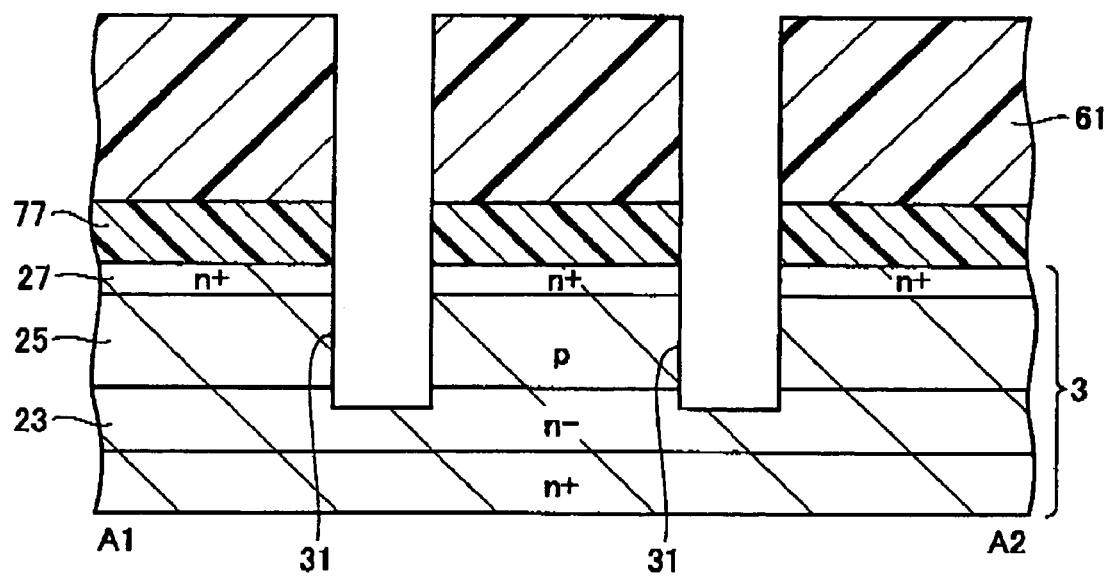
FIG. 26 is a process diagram of a second step in the method (A1–A2 section)

As shown in FIGS. 26 and 9, the resist 61 is employed as a mask to selectively remove the intermediate insulator film 77, the source region 27 and the body region 25. As a result, the gate trenches 31 are formed in the semiconductor layer 3, as passing through the intermediate insulator film 77, the source region 27 and the body region 25 and reaching the drift region 23.

Figure 27:
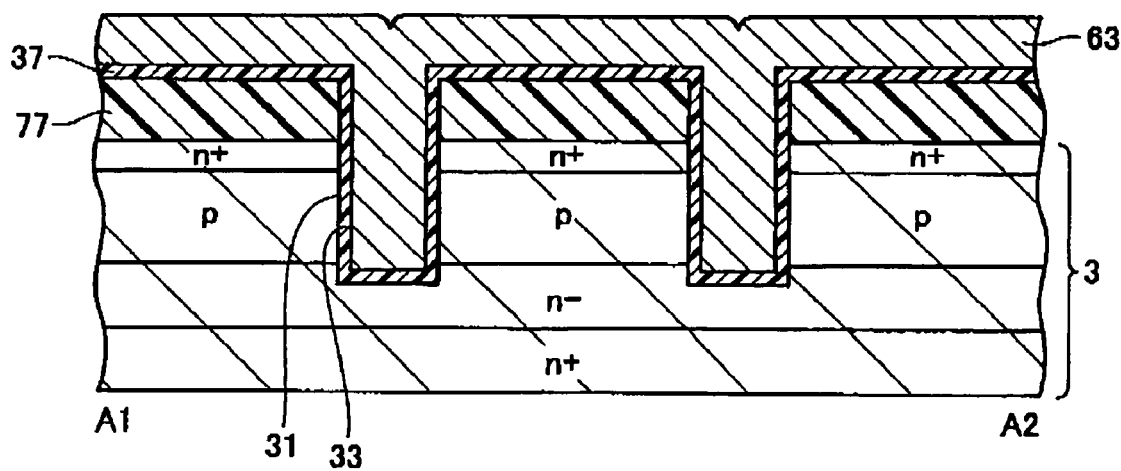
FIG. 27 is a process diagram of a third step in the method (A1–A2 section)

As shown in FIGS. 27 and 11, the gate insulator film 33 is formed on the surface of the gate trench 31, and the insulator film 37 on the intermediate insulator film 77 and the p-type silicon region 21. The gate insulator film 33 and the insulator film 37 are composed of an ONO film (a triple-layered film of silicon oxide, silicon nitride and silicon oxide), for example. Then, CVD is employed, for example, to form the polysilicon film 63 over one surface of the semiconductor layer 3 to fill the gate trench 31.

Figure 28:
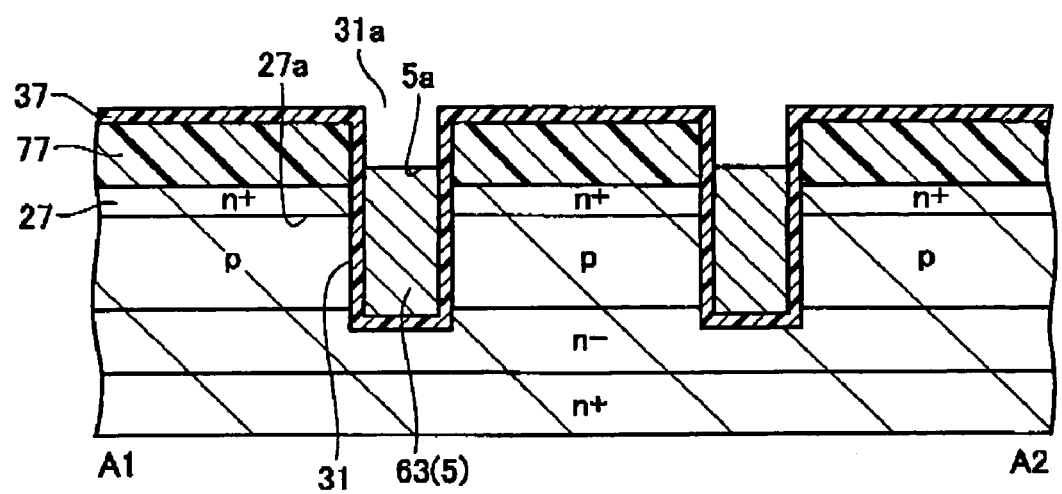
FIG. 28 is a process diagram of a fourth step in the method (A1–A2 section)

As shown in FIGS. 28 and 13, the polysilicon film 63 is exposed in the region for forming the MOSFET. In addition, the resist 65 is formed to partly cover the polysilicon film 63 located in the region for forming the gate routing wire. The resist 65 (an example of the mask pattern) is employed as a mask for selectively etching the polysilicon film 63 to form the gate 5 in the gate trench 31 and form the polysilicon portions 39 of the gate routing wire. The upper surface 5a of the gate 5 is located higher than the bottom 27a of the source region 27 and lower than the entrance 31a of the gate trench 31.

Figure 29:
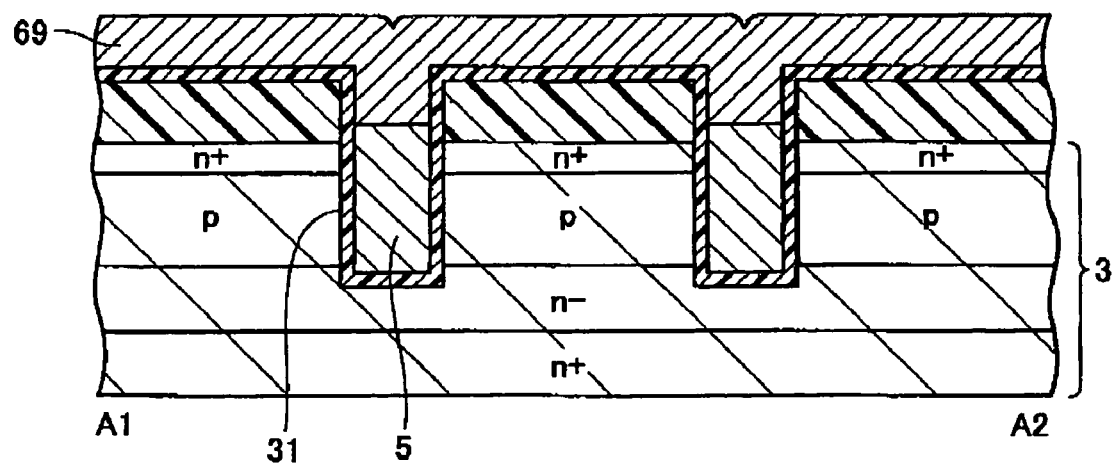
FIG. 29 is a process diagram of a fifth step in the method (A1–A2 section)
Figure 30:
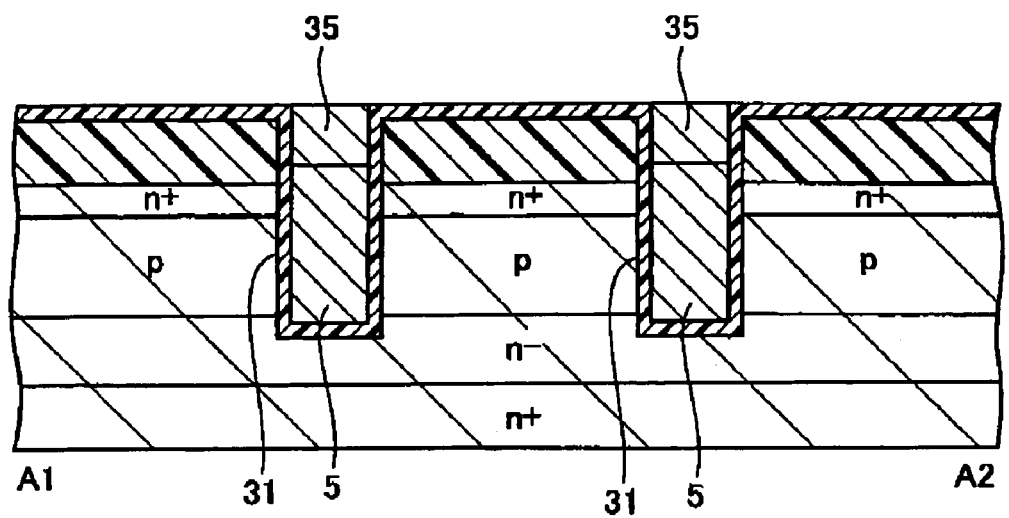
FIG. 30 is a process diagram of a sixth step in the method (A1–A2 section)

As shown in FIGS. 29 and 15, the metal film 69 is formed for covering one surface of the semiconductor layer 3 to fill the gate trench 31. Then, as shown in FIGS. 30 and 17, the metal film 69 is etched back to form the buried metal film 35 located above the gate 5 in the gate trench 31 and form the metal portions 41 of the gate routing wire 7.

Figure 31:
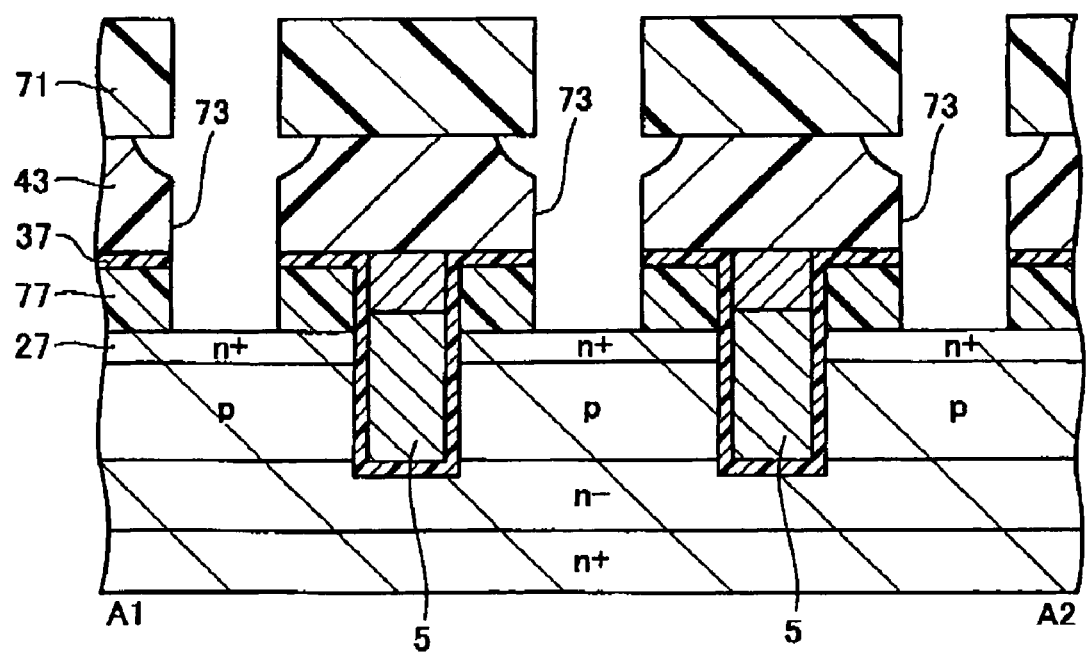
FIG. 31 is a process diagram of a seventh step in the method (A1–A2 section)

As shown in FIGS. 31 and 19, the interlayer insulator film 43 is formed over the gate routing wire 7 and the gates 5, and the resist 71 is formed on the interlayer insulator film 43. The resist 71 is employed as a mask for isotropic etching to remove the upper portion of the interlayer insulator film 43. An etching is subsequently performed for removing the remainder of the interlayer insulator film 43, and the insulator film 37 and the intermediate insulator film 77 to form the contact holes 73 reaching the source region 27. The resist 71 is then removed.

The presence of the intermediate insulator film 77 increases the aspect ratio of the contact hole 73. In order to prevent the contact hole 73 from not being filled with the electrode portion, a combination of the isotropic etching and the anisotropic etching is employed to form the contact hole 73.

Subsequent steps (the step of forming the electrode portion 11, the step of forming the underlay metal film 45, the step of arranging the strap electrode plate 13, and the step of connecting the strap electrode plate 13 commonly to a plurality of the electrode portions 11) are same as in the first embodiment and accordingly omitted herein.

Third Embodiment

Structure of Power Semiconductor Device

Figure 32:
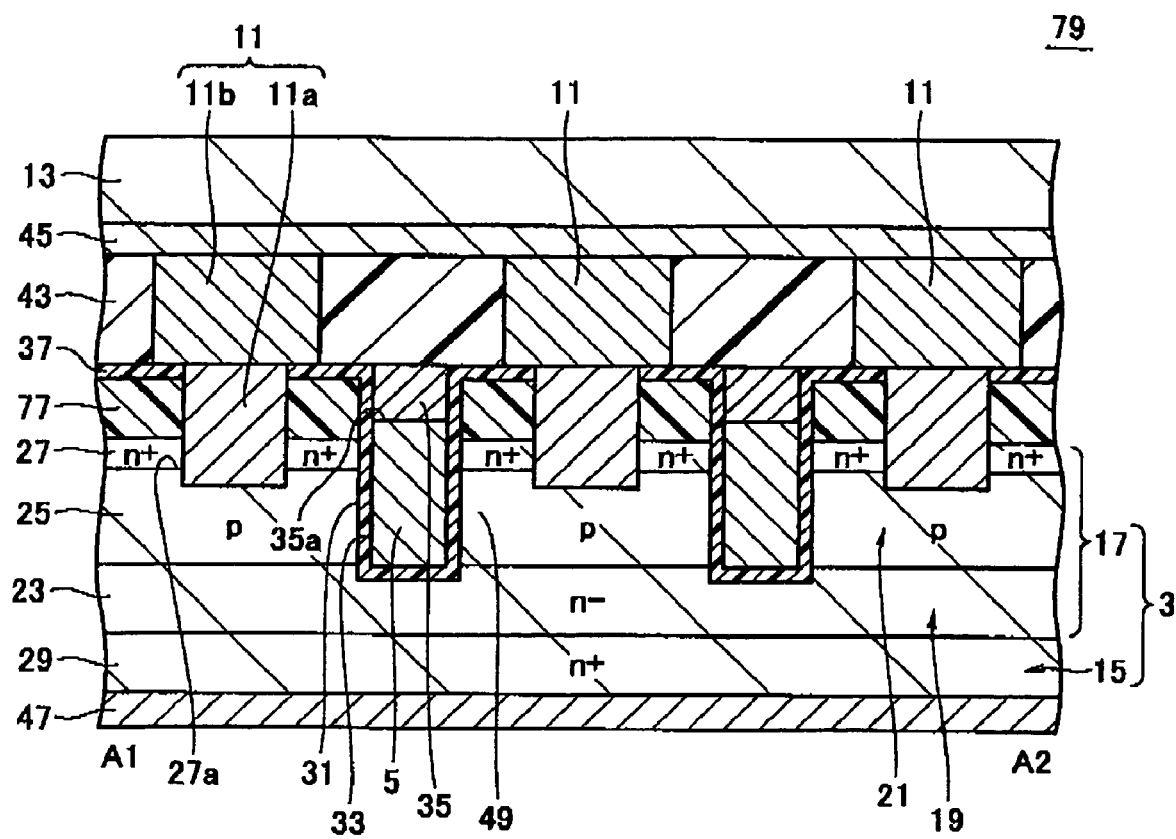
FIG. 32 shows a sectional structure of a MOSFET provided in a power semiconductor device according to a third embodiment.

FIG. 32 shows a sectional structure of a MOSFET provided in a power semiconductor device 79 according to a third embodiment and corresponds to FIG. 22. The region for forming the gate routing wire in the third embodiment is same as in FIG. 3. The third embodiment mainly differs from the second embodiment shown in FIG. 22 in that the electrode portion 11 extends into the semiconductor layer 3 down to a location deeper than the source region 27. This is effective to lower the depletion layer and achieve a relieved electric field at the channel region 49, a shrunken MOSFET pattern and a reduced gate-drain capacity.

Method of Manufacturing Power Semiconductor Device

Figure 33:
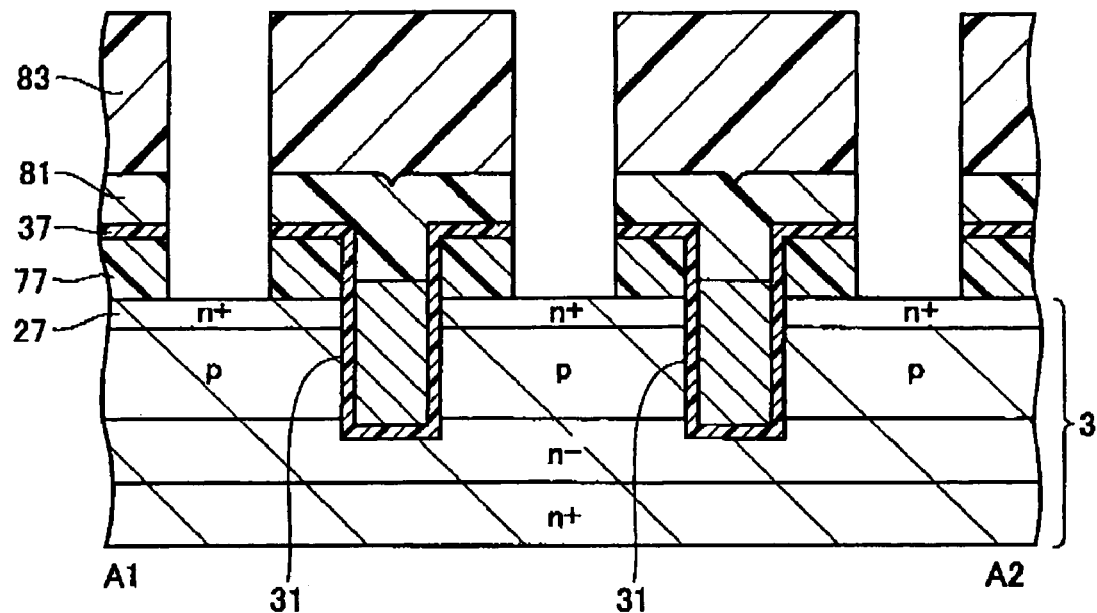
FIG. 33 is a process diagram of a first step in a method of manufacturing the power semiconductor device according to the third embodiment (A1–A2 section)
Figure 34:
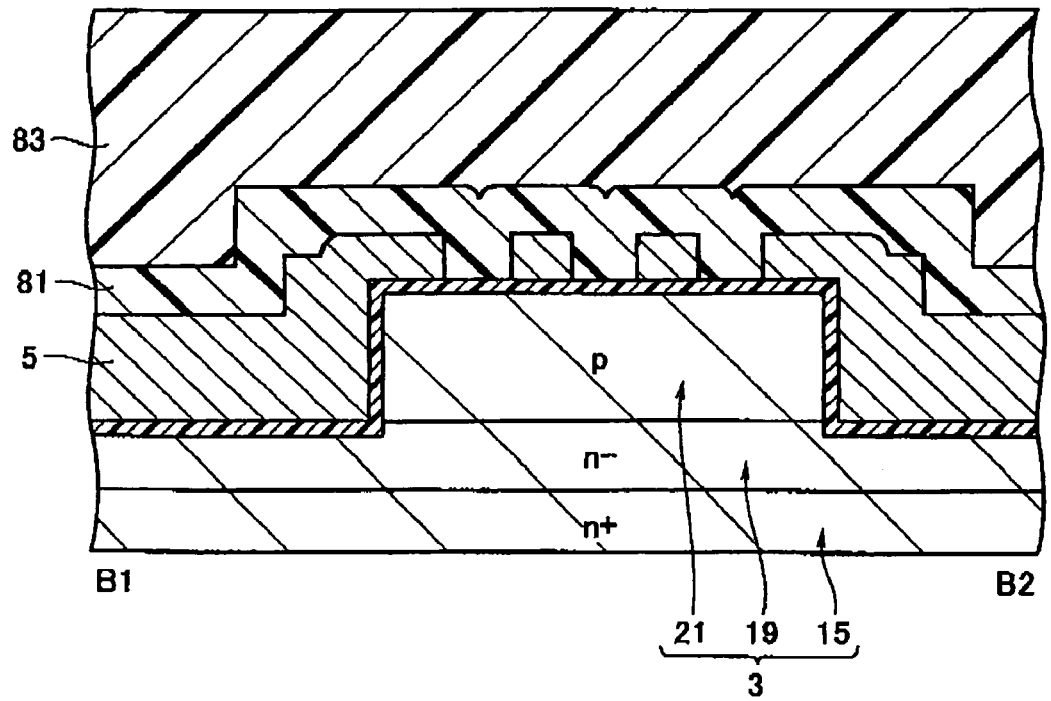
FIG. 34 is a process diagram of the first step in the method (B1–B2 section)

A method of manufacturing the power semiconductor device 79 according to the third embodiment is described concentrating on differences from that of the second embodiment. After the process steps shown in FIGS. 28 and 13, a silicon oxide film 81 is formed on one surface of the semiconductor layer 3 by CVD, for example, as shown in FIGS. 33 and 34. A resist 83 having apertures each between the gate trenches 31 is formed on the silicon oxide film 81. The resist 83 is employed as a mask for selective anisotropic etching (first etching) of the silicon oxide film 81, the insulator film 37 and the intermediate insulator film 77 to expose the source region 27. The resist 83 is then removed.

Figure 35:
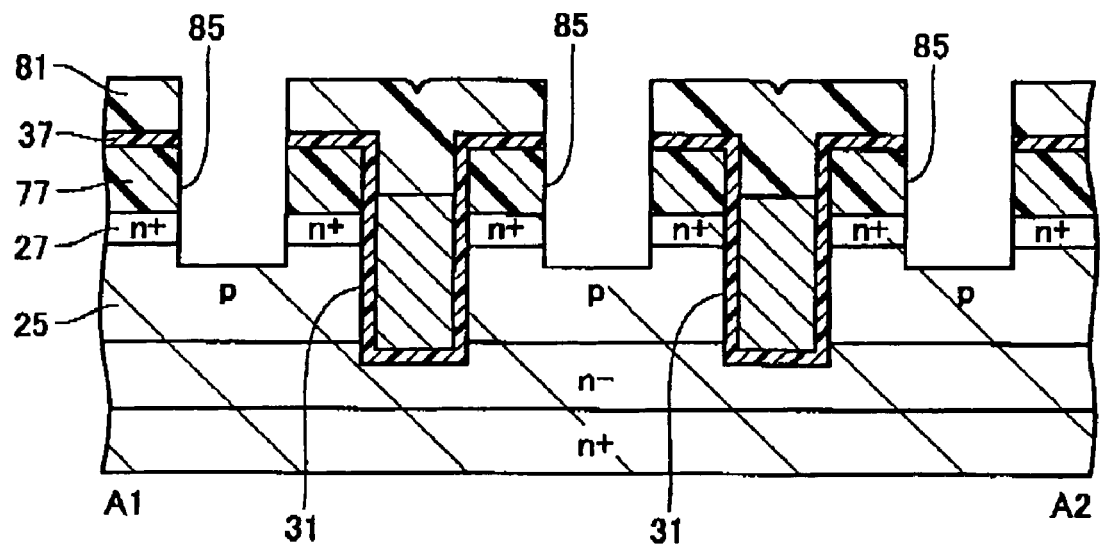
FIG. 35 is a process diagram of a second step in the method (A1–A2 section)
Figure 36:
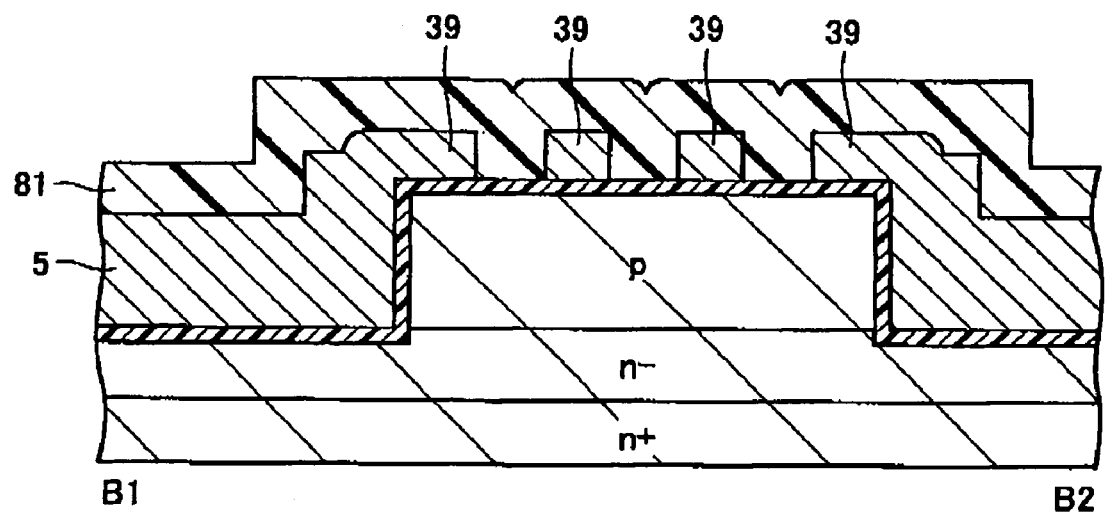
FIG. 36 is a process diagram of the second step in the method (B1–B2 section)

As shown in FIGS. 35 and 36, the silicon oxide film 81 is employed as a mask for anisotropic etching (second etching) of the source region 27. The first and second etchings form source trenches 85 (an example of the current path trench) each passing through the intermediate insulator film 77 and the source region 27 between the gate trenches 31.

Figure 37:
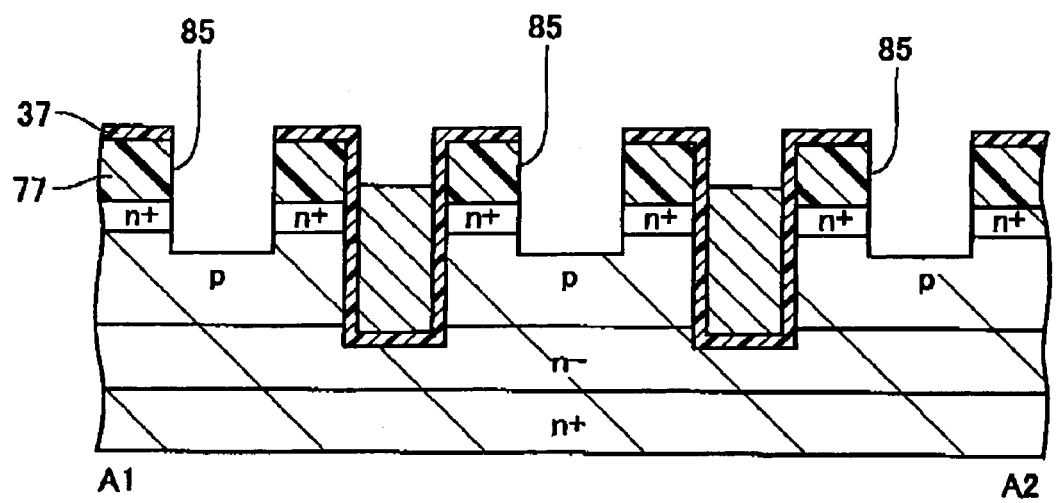
FIG. 37 is a process diagram of a third step in the method (A1–A2 section)
Figure 38:
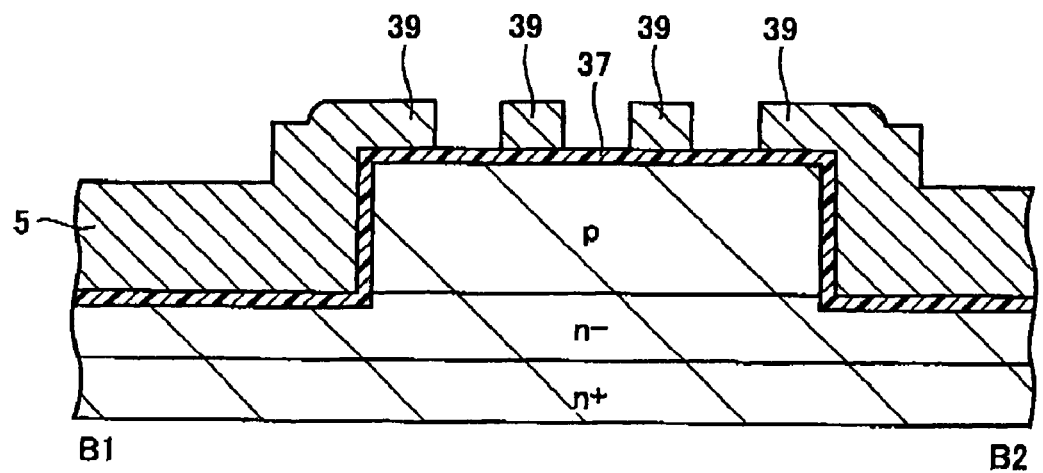
FIG. 38 is a process diagram of the third step In the method (B1–B2 section)

As shown in FIGS. 37 and 38, the insulator film 37 composed of an ONO film is employed as a stopper to remove the silicon oxide film 81 that was used as the mask in the previous step. The insulator film 37 prevents removal of the intermediate insulator film 77 composed of silicon oxide together with the silicon oxide film 81. The gate insulator film 33 is the ONO film and accordingly can improve reliability of the gate.

Figure 39:
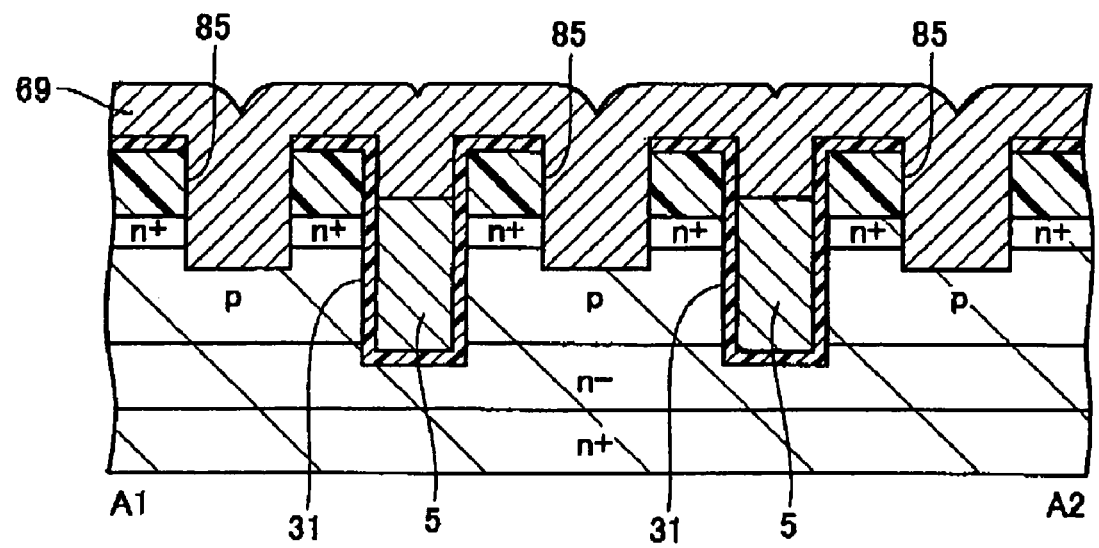
FIG. 39 is a process diagram of a fourth step in the method (A1–A2 section)
Figure 40:
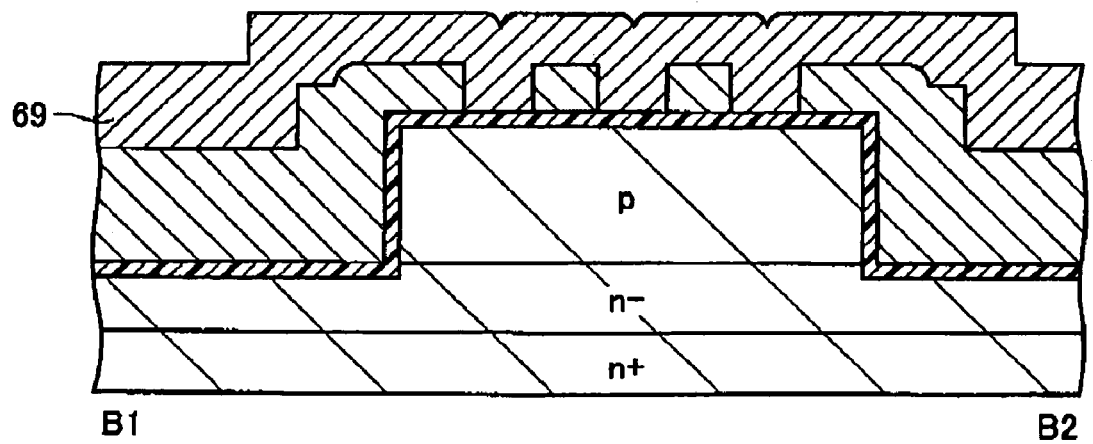
FIG. 40 is a process diagram of the fourth step in the method (B1–B2 section)
Figure 41:
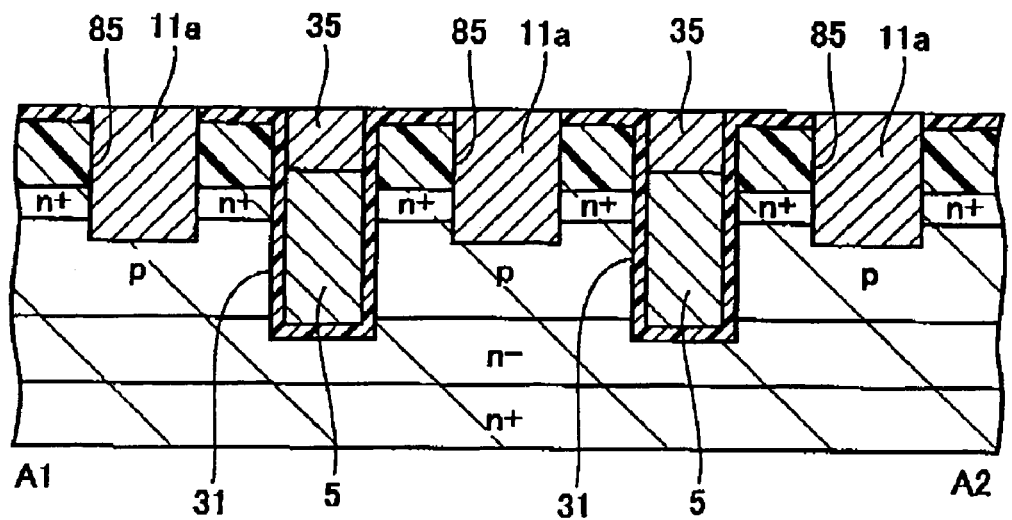
FIG. 41 is a process diagram of a fifth step in the method (A1–A2 section)
Figure 42:
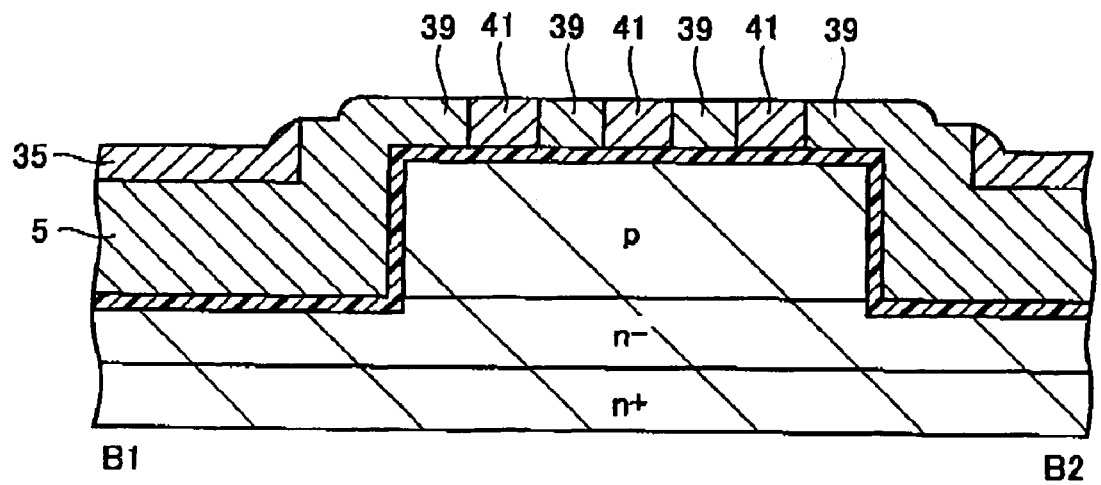
FIG. 42 is a process diagram of the fifth step in the method (B1–B2 section)

As shown in FIGS. 39 and 40, the metal film 69 is formed over one surface of the semiconductor layer 3 to fill the gate trenches 31 and the source trenches 85. As shown In FIGS. 41 and 42, the metal film 69 is then etched back to form the buried metal film 35 located on the gate 5 in the gate trench 31. In addition, the metal portions 41 of the gate routing wire are formed in the remainder of the region for forming the gate routing wire, and the lower part 11a of the electrode portion 11 is formed in the source trench 85. Instead of etched back, the buried metal film 35 and the lower part 11a can be formed by photo lithography. The upper surface of the lower part 11a of the electrode portion 11 and the upper surface of the buried metal film 35 are located at the same height. The lower part 11a is formed in the source trench 85 (the current path trench) that is provided in the intermediate insulator film between the gate trenches 31.

Figure 43:
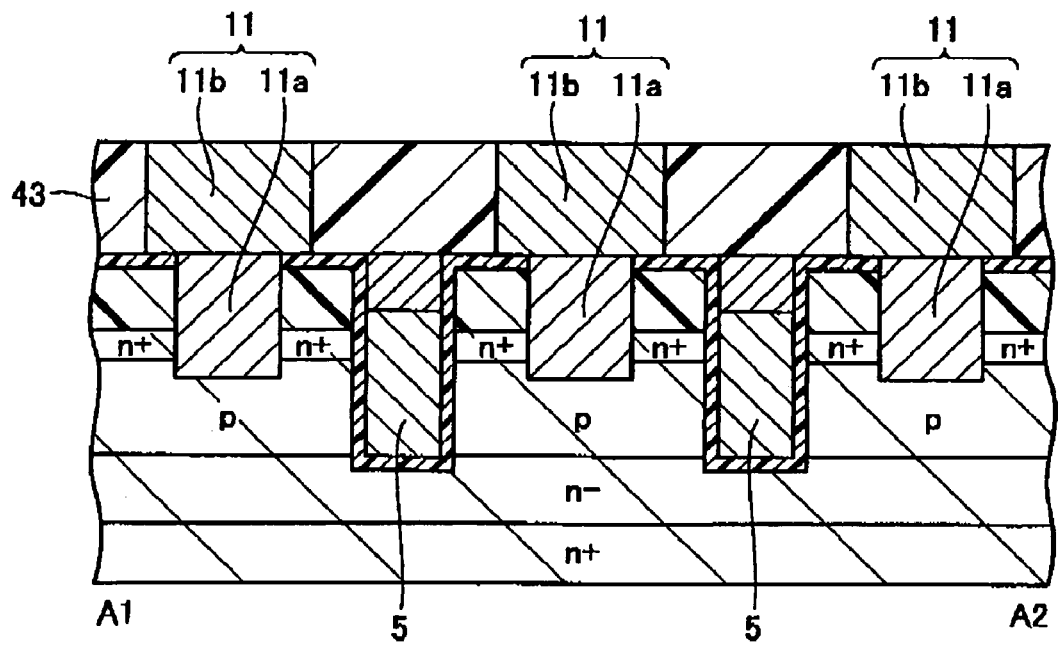
FIG. 43 is a process diagram of a sixth step in the method (A1–A2 section)
Figure 44:
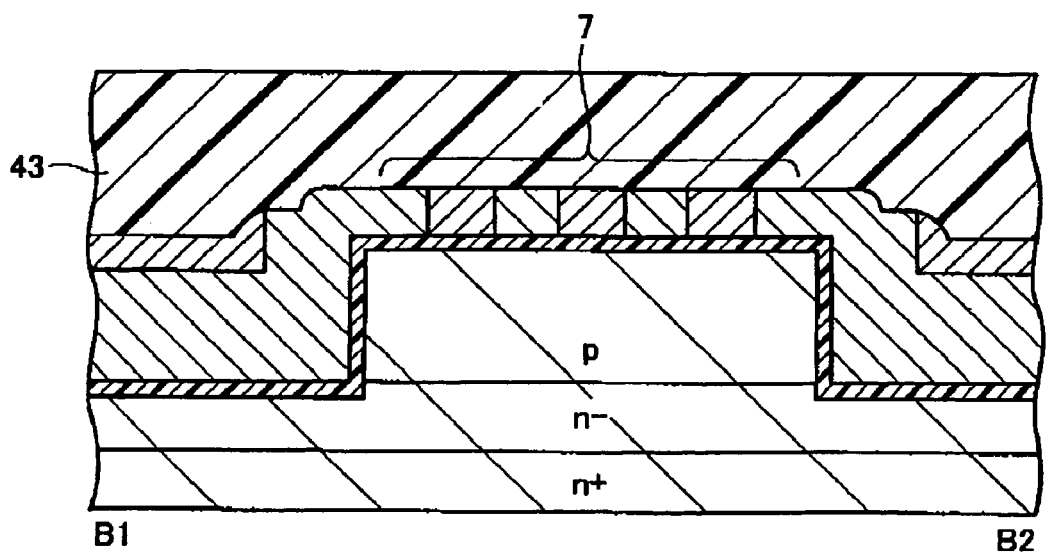
FIG. 44 is a process diagram of the sixth step in the method (B1–B2 section)

As shown in FIGS. 43 and 44, the interlayer insulator film 43 is formed over the gate routing wire 7, the gates 5 and the lower parts 11a of a plurality of the electrode portions 11. Processes of photolithography and anisotropic etching are applied to selectively remove the interlayer insulator film 43 to form through holes reaching the lower parts 11a of the electrode portion 11. An aluminum film is formed on the interlayer insulator film 43 by sputtering, for example, to fill the through holes. The aluminum film is then patterned to form the upper part 11b of the electrode portion in the interlayer insulator film 43, which is connected to the lower part 11a of the electrode portion.

Subsequent steps (the step of forming the underlay metal film 45, the step of arranging the strap electrode plate 13, and the step of connecting the strap electrode plate 13 commonly to a plurality of the electrode portions 11) are same as in the first embodiment and accordingly omitted herein.

Fourth Embodiment

In the third embodiment, as shown in FIGS. 35 and 36, the source trenches 85 are formed after the gate trenches 31 and the polysilicon portions 39 are formed. To the contrary, in a fourth embodiment, after the gate trenches are formed, the source trenches and the polysilicon portions are formed simultaneously. The fourth embodiment is described below concentrating on differences from the second and third embodiments.

Figure 45:
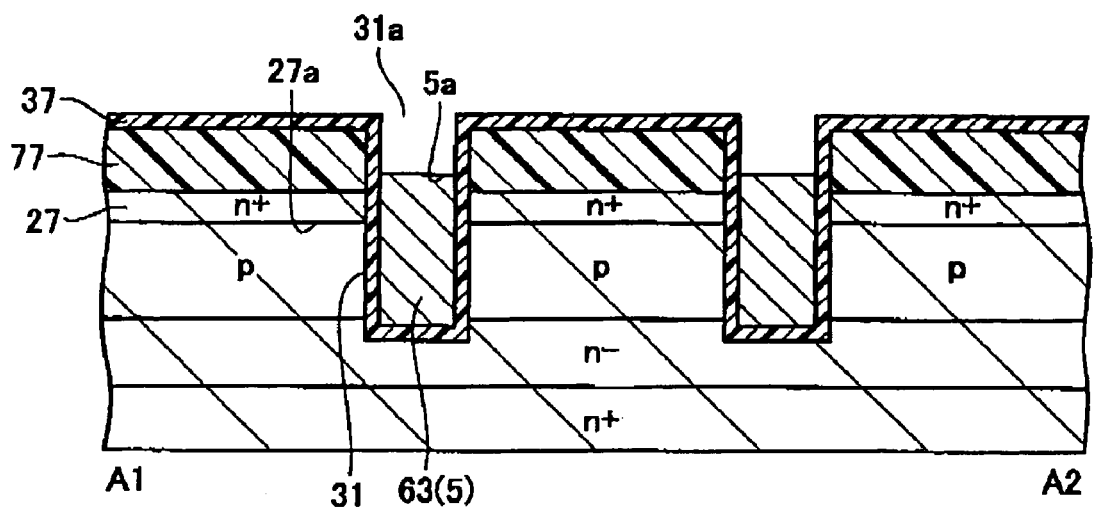
FIG. 45 is a process diagram of a first step in a method of manufacturing a power semiconductor device according to a fourth embodiment (A1–A2 section)
Figure 46:
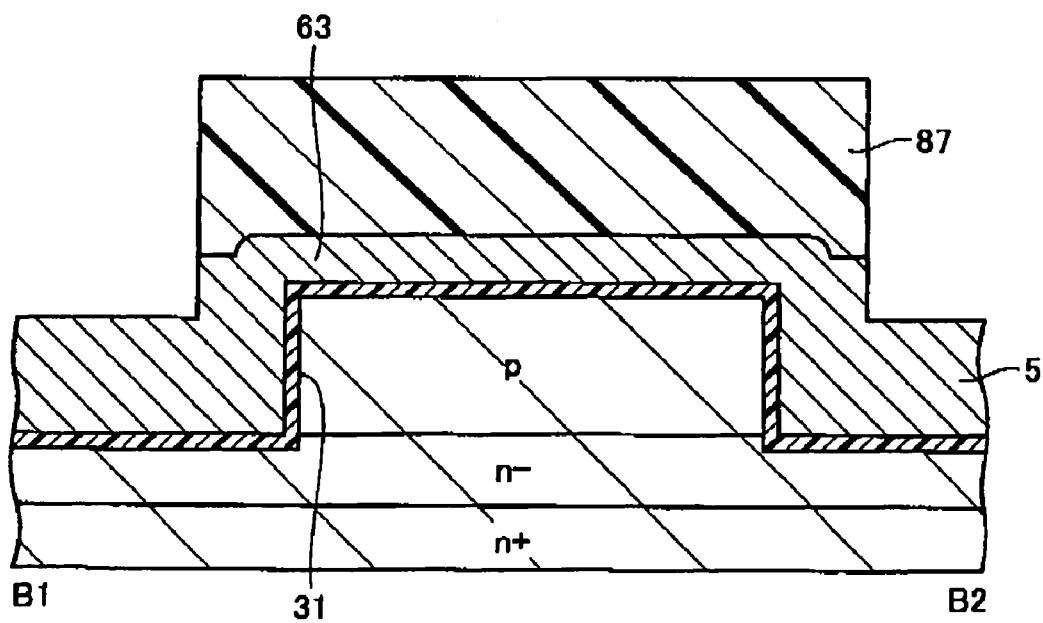
FIG. 46 is a process diagram of the first step in the method (B1–B2 section)

The steps up to FIGS. 27 and 11 are same as in the second embodiment. As shown in FIGS. 45 and 46, a resist 87 is employed as a mask for selective etching of the polysilicon film 63 to form the gate 5 in the gate trench 31. This step corresponds to the step shown in FIGS. 28 and 13 except that the resist 87 differs in pattern from the resist 65. The resist 87 (an example of the first mask pattern) covers entirely, not partly, the polysilicon film 63 located in the region for forming the gate routing wire. Accordingly, in the fourth embodiment the polysilicon portions are not formed and only the gates 5 are formed at this stage.

Figure 47:
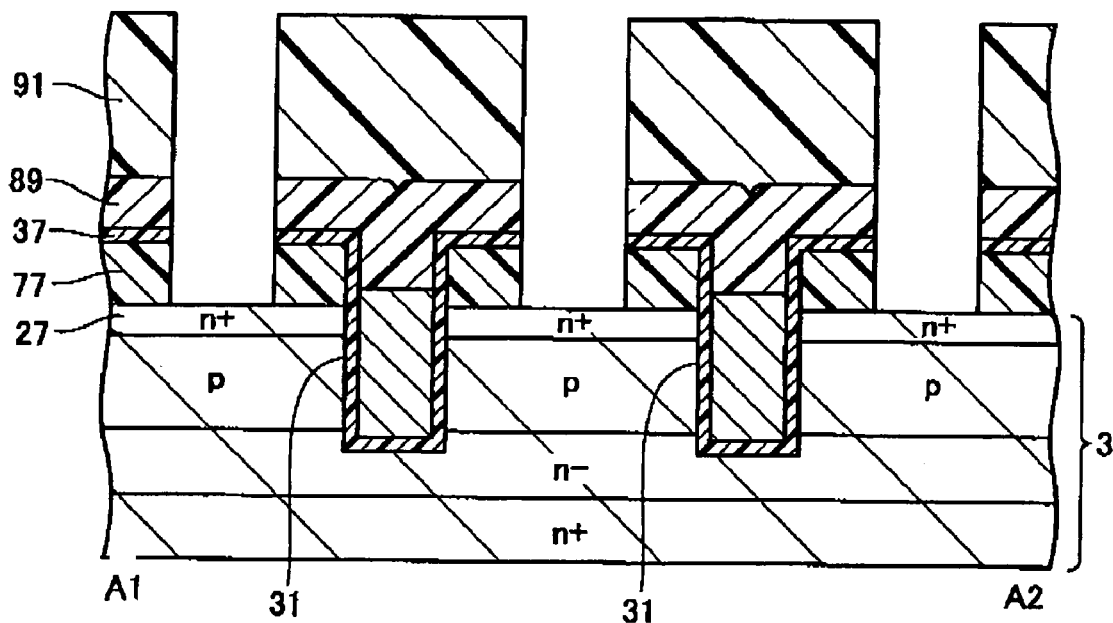
FIG. 47 is a process diagram of a second step in the method (A1–A2 section)
Figure 48:
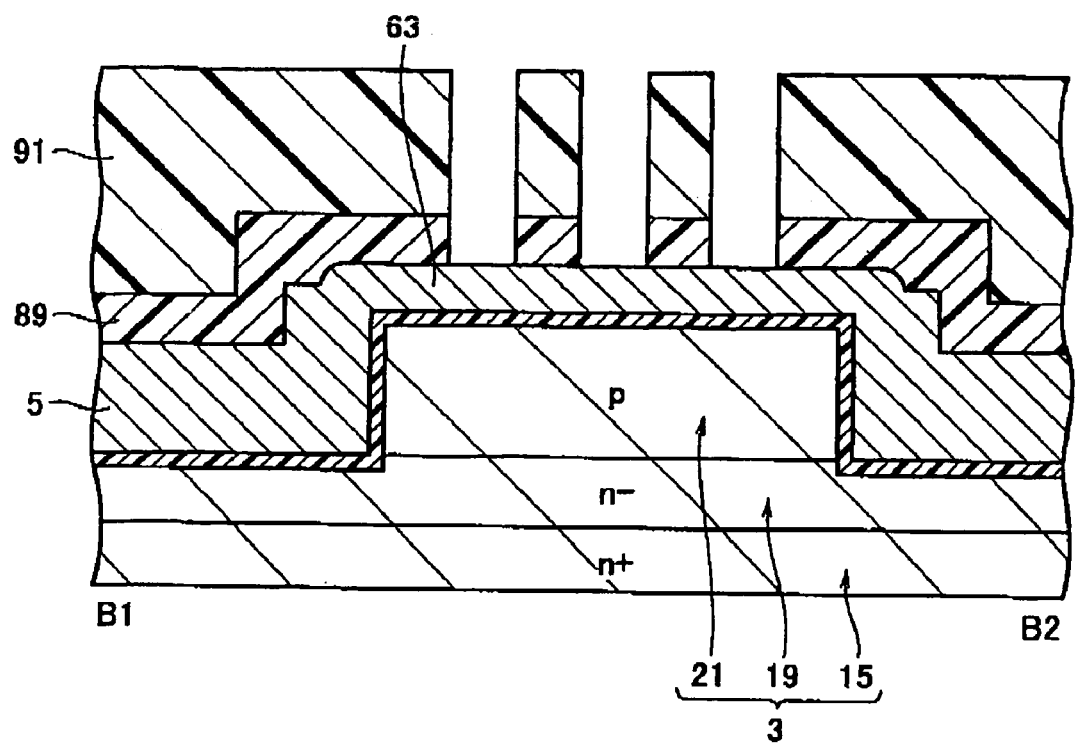
FIG. 48 is a process diagram of the second step in the method (B1–B2 section)

As shown in FIGS. 47 and 48, a silicon oxide film 89 is formed by, for example, CVD over one surface of the semiconductor layer 3. A resist 91 is then formed on the silicon oxide film 89. The resist 91 has apertures partly on the polysilicon 63 located in the region for forming the gate routing wire and has apertures each between the gate trenches 31. The apertures of the resist 91 in the region for forming the gate routing wire correspond to the metal portions of the gate routing wire.

The resist 91 is employed as a mask for selective anisotropic etching of the silicon oxide film 89, the insulator film 37 and the intermediate insulator film 77 to expose the source region 27 and the polysilicon film 63 partly. The resist 91 is then removed. The silicon oxide film 89 has apertures partly on the polysilicon 63 located in the region for forming the gate routing wire and has apertures each between the gate trenches 31 to serve as a mask in the next step.

Figure 49:
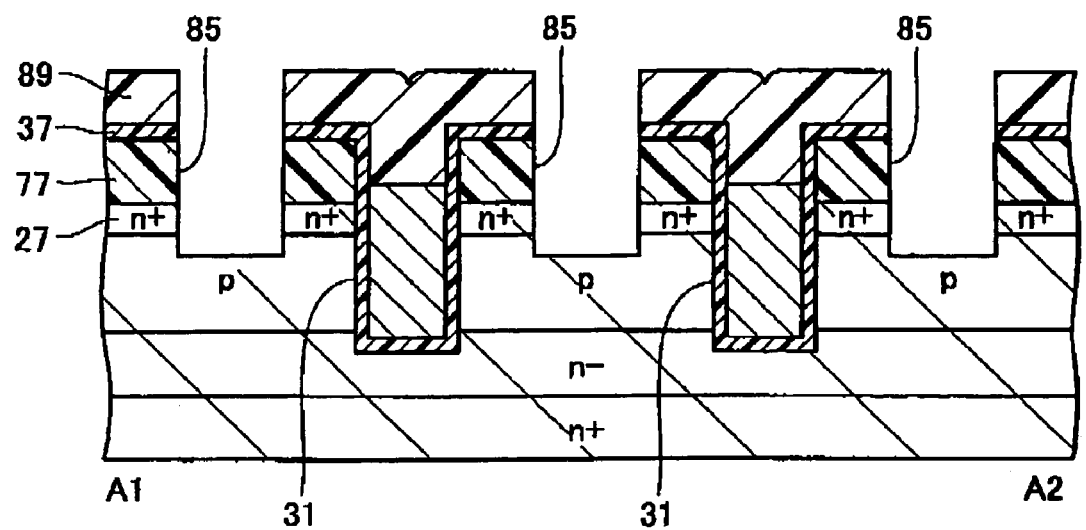
FIG. 49 is a process diagram of a third step in the method (A1–A2 section)
Figure 50:
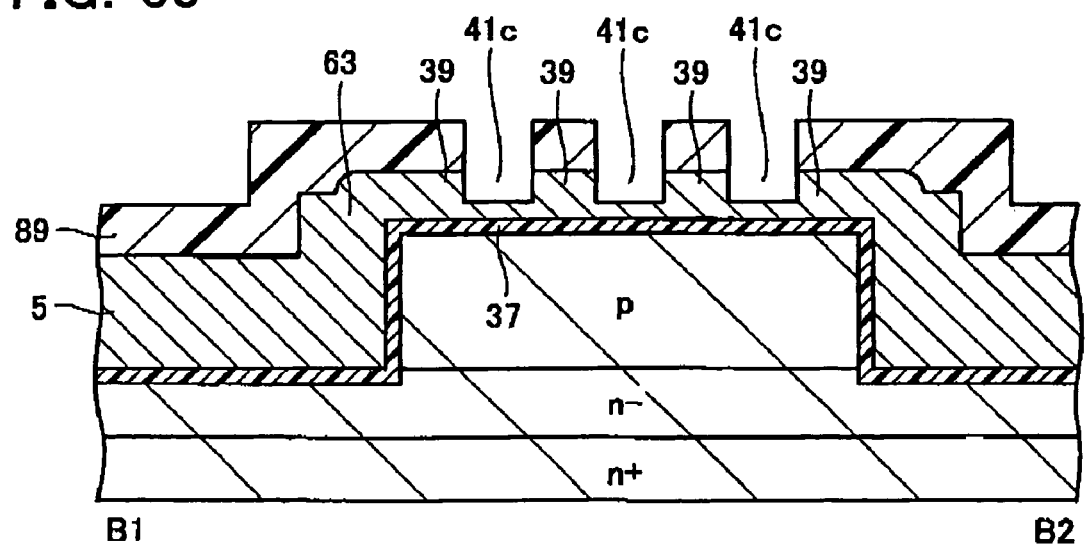
FIG. 50 is a process diagram of the third step in the method (B1–B2 section)

As shown in FIGS. 49 and 50, the silicon oxide film 89 (an example of the second mask pattern) is employed as a mask for selective anisotropic etching of the polysilicon film 63 and the source region 27, As a result, the polysilicon portions 39 are formed partly in the region for forming the gate routing wire, and the source trenches 85 passing through the source region 27 are formed.

The etching of the polysilicon film 63 is stopped before it reaches the insulator film 37. A larger depth of the source trench 85 allows the etching of the polysilicon film 63 to reach the insulator film 37.

Subsequent steps are same as those of FIGS. 37 and 38 in the third embodiment: the insulator film 37 composed of the ONO film is employed as a stopper to remove the silicon oxide film 89 that was used as the mask in the previous step.

Further subsequent steps are same as those in the third embodiment and accordingly omitted to avoid a duplicate explanation.

In the third embodiment shown in FIG. 36, the silicon oxide film 81 covers the regions for forming the metal portions. To the contrary, in the fourth embodiment, as shown in FIG. 50, regions 41c for forming the metal portions are not covered in the silicon oxide film 89. Therefore, the silicon oxide film 89 does not remain in the regions 41c for forming the metal portions, and the regions 91 for forming the metal portions can be filled entirely with the metal portions.

Figure 51:
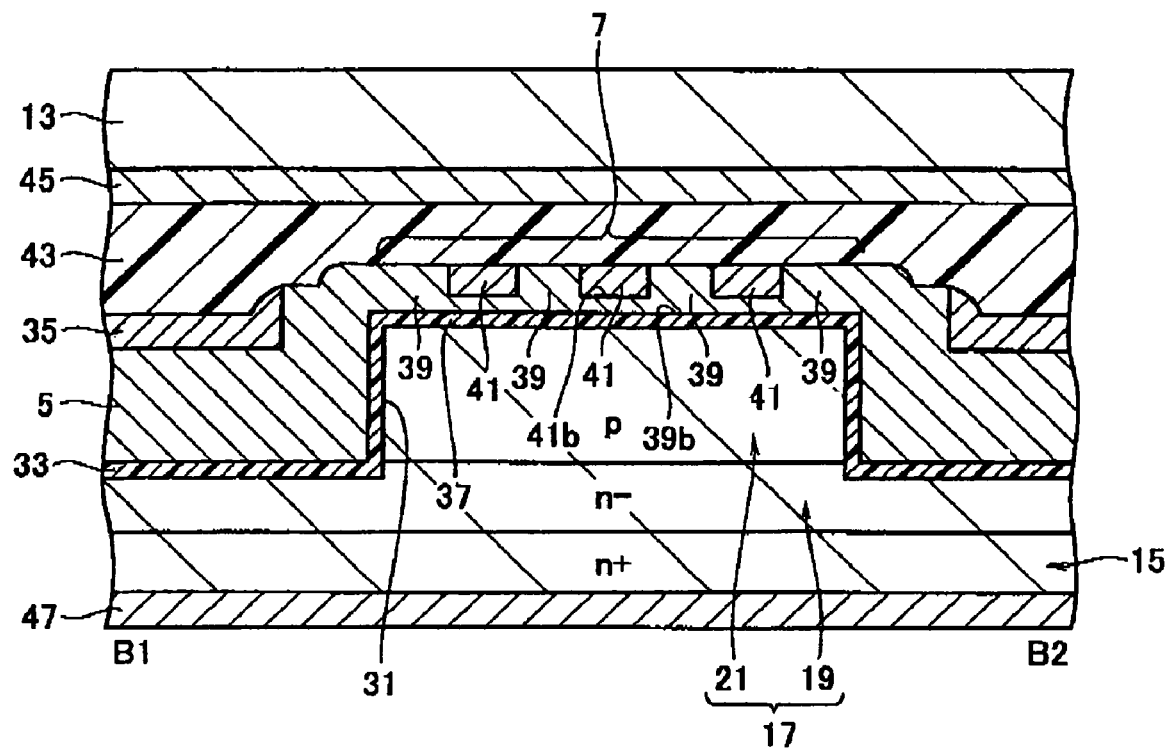
FIG. 51 shows a sectional structure of a gate routing wire provided in the power semiconductor device according to the fourth embodiment.

In the fourth embodiment the MOSFET structure is same as that of the third embodiment shown in FIG. 32 except for the structure of the gate routing wire, which is shown in FIG. 51. The bottom 41b of the metal portion 41 is located higher than the bottom 39b of the polysilicon portion 39 because the etching of the polysilicon film 63 is stopped before It reaches the insulator film 37 as described previously.

Fifth Embodiment

Figure 52:
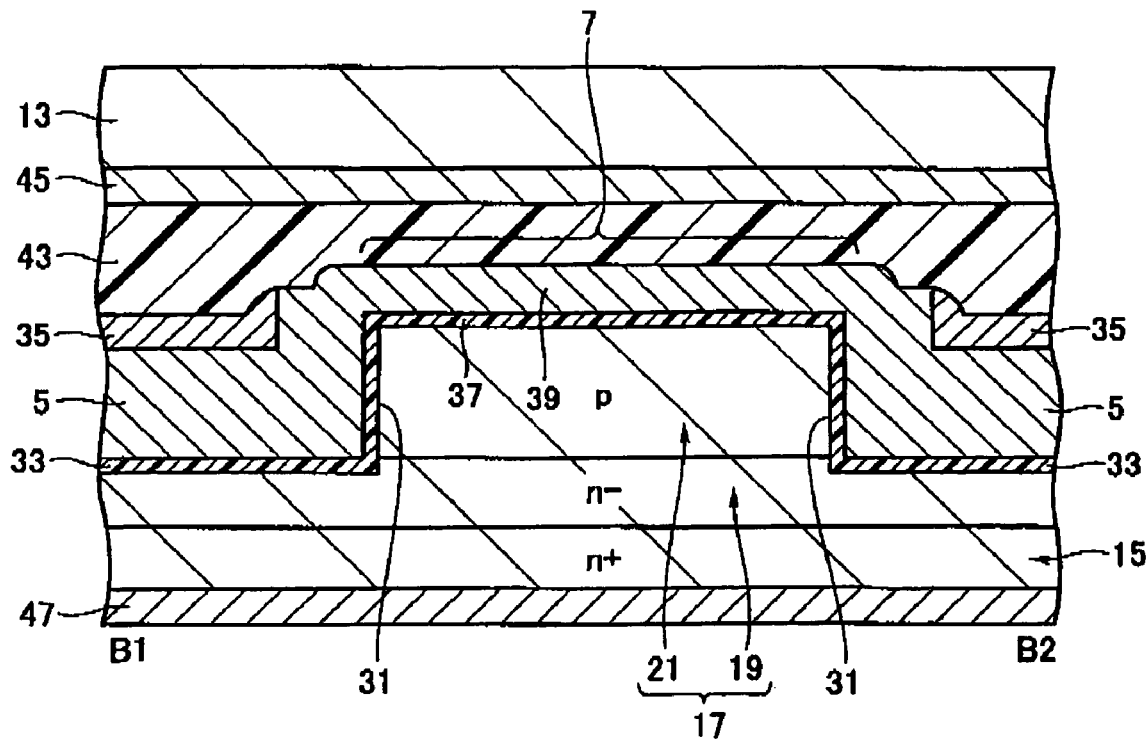
FIG. 52 shows a sectional structure of a gate routing wire provided in a power semiconductor device according to a fifth embodiment (B1–B2 section)
Figure 53:
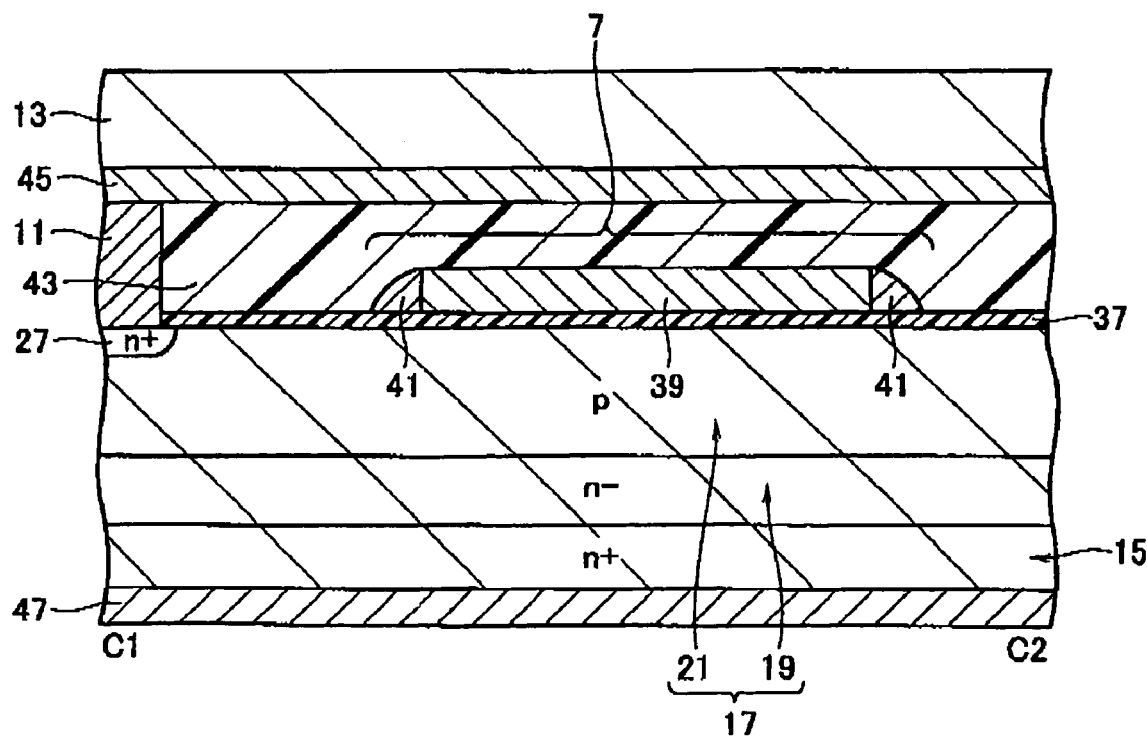
FIG. 53 shows a sectional structure of the same (C1–C2 section)

A fifth embodiment is described concentrating on differences from the first embodiment. FIGS. 52 and 53 show sectional structures of a gate routing wire provided in a power semiconductor device according to the fifth embodiment. FIG. 52 corresponds to FIG. 3 and shows a B1–B2 section of FIG. 1. FIG. 53 shows a C1–C2 section of FIG. 1. The metal portions 41 configure sides of the gate routing wire 7 and have a sidewall shape.

Sixth Embodiment

Figure 54:
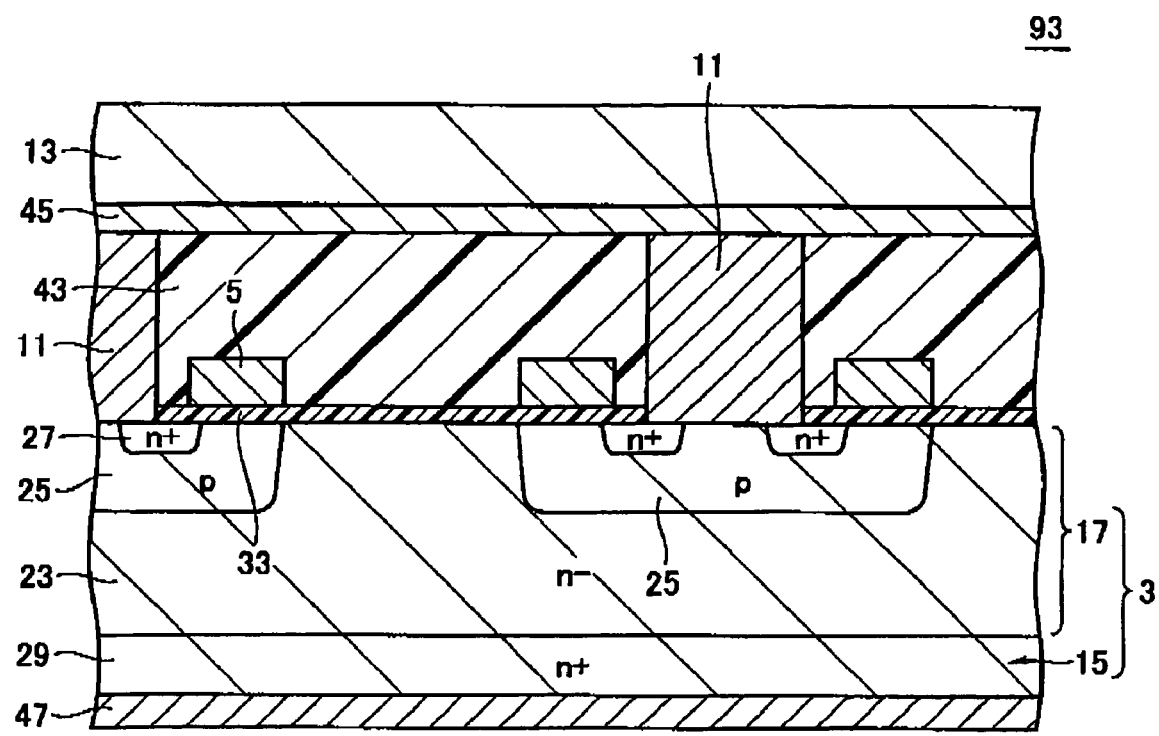
FIG. 54 shows a sectional structure of a planar power MOSFET provided in a power semiconductor device according to a sixth embodiment.

A power semiconductor device 93 according to a sixth embodiment shown in FIG. 54 comprises a planar power MOSFET. A gate routing wire in the sixth embodiment is same as the gate routing wire 7 of FIG. 3.

The gate 5 is formed on one surface of the semiconductor layer 3 via the gate insulator film 33. Located below one side of the gate 5 is the source region 27, which is formed in the body region 25. Located below the other side of the gate 5 is the drift region 23. The electrode portion 11 is in contact with the source region 27 and the body region 25.

Seventh Embodiment

Figure 55:
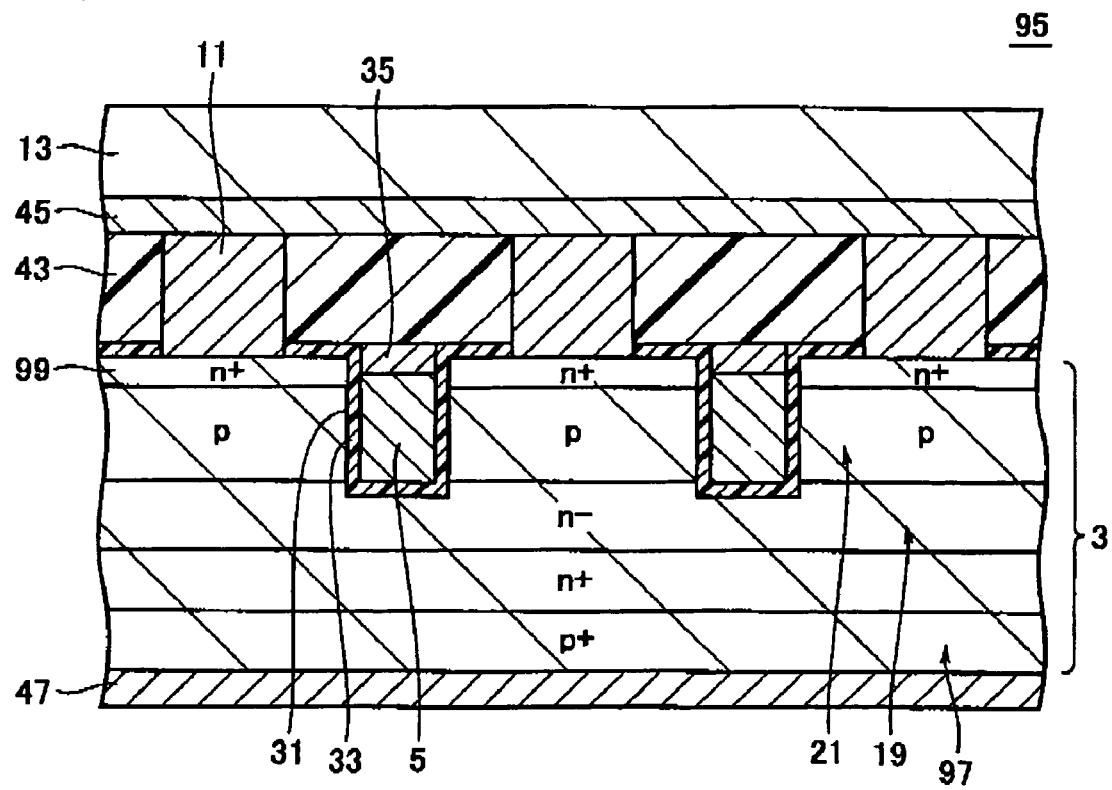
FIG. 55 shows a sectional structure of an IGBT provided in a power semiconductor device according to a seventh embodiment.
Figure 56:
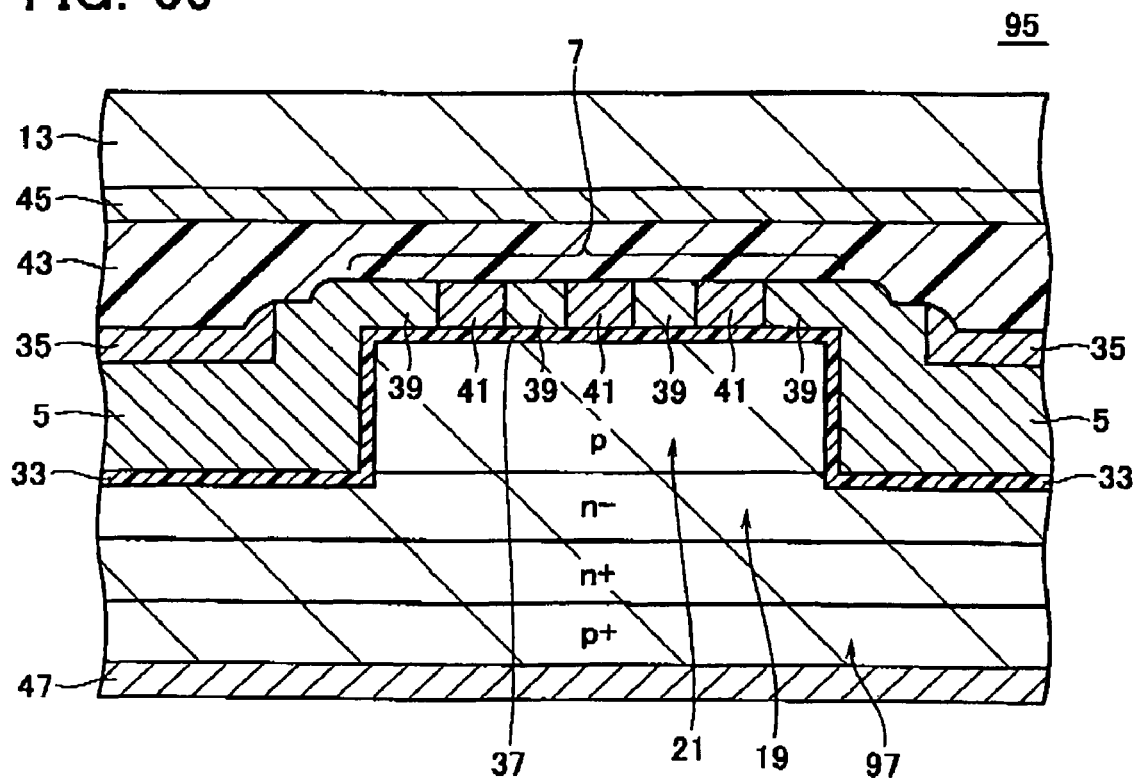
FIG. 56 shows a sectional structure of a gate routing wire provided in the power semiconductor device according to the seventh embodiment.

A power semiconductor device according to a seventh embodiment comprises a trench-gate-structured IGBT (U-IGBT). FIG. 55 shows a sectional structure of the IGBT provided in the power semiconductor device 95 and corresponds to FIG. 2. FIG. 56 shows a sectional structure of a gate routing wire provided in the power semiconductor device 95 and corresponds to FIG. 3.

As the seventh embodiment is directed to the IGBT, a $p^+$-type silicon region 97 (an example of the second semiconductor region) serving as a collector region is added to the structure shown in FIGS. 2 and 3. The source region 27 (FIG. 2) serves as an emitter region 99 (FIG. 55) that is an example of the first semiconductor region.

What is claimed is:

1. A power semiconductor device, comprising:
a semiconductor layer;
polysilicon-containing gates;
a first semiconductor region formed in said semiconductor layer at one surface of said semiconductor layer and operative to serve as at least one of a source region and an emitter region;
a second semiconductor region formed in said semiconductor layer at the other surface of said semiconductor layer and operative to serve as at least one of a drain region and a collector region;

a gate routing wire commonly connected to a plurality of said gates and including a polysilicon portion and a metal portion formed adjacent to it in the direction of plane of said semiconductor layer;

an interlayer insulator film formed to cover said first semiconductor region, said gate routing wire and a plurality of said gates;

electrode portions formed in said interlayer insulator film and connected to said first semiconductor region;

a strap electrode plate located to cover said interlayer insulator on said gate routing wire and cover a plurality of said electrode portions and commonly connected to a plurality of said electrode portions, and a buried metal portion formed on and connected to said gate in said gate trench, wherein the bottom of said buried metal portion is located higher than the bottom of said first semiconductor region, wherein said gate is formed on a gate insulator film in a gate trench, said gate trench extending from one surface of said semiconductor layer into said semiconductor layer.

2. The power semiconductor device according to claim 1, further comprising:

an intermediate insulator film formed between one surface of said semiconductor layer and said interlayer insulator film and having a larger thickness than said gate insulator film.

3. The power semiconductor device according to claim 1, wherein said electrode portion extends into said semiconductor layer down to a location deeper than said first semiconductor region.

4. The power semiconductor device according to claim 1, wherein said metal portion extends along the direction of extension of said gate routing wire.

5. The power semiconductor device according to claim 1, wherein said metal portion configures a side of said gate routing wire and having a sidewall shape.

6. The power semiconductor device according to claim 1, wherein said metal portion and said polysilicon portion are formed to have substantially the same height.

7. The power semiconductor device according to claim 1, wherein said gate routing wire has a portion extending in a direction intersecting the direction of extension of said gate, said portion being commonly connected to said plurality of gates.

8. A power semiconductor device comprising:
a semiconductor layer;
polysilicon-containing gates;
a first semiconductor region formed in said semiconductor layer at one surface of said semiconductor layer and operative to serve as at least one of a source region and an emitter region;
a second semiconductor region formed in said semiconductor layer at the other surface of said semiconductor layer and operative to serve as at least one of a drain region and a collector region;
a gate routing wire commonly connected to a plurality of said gates and including a polysilicon portion and a metal portion formed adjacent to it in the direction of plane of said semiconductor layer;
an interlayer insulator film formed to cover said first semiconductor region, said gate routing wire and a plurality of said gates;
electrode portions formed in said interlayer insulator film and connected to said first semiconductor region; and
a strap electrode plate located to cover said interlayer insulator on said gate routing wire and cover a plurality of said electrode portions and commonly connected to a plurality of said electrode portions,
wherein said metal portions and said polysilicon portions are arranged alternately.

9. The power semiconductor device according to claim 8, wherein the bottom of said metal portion is located higher than the bottom of said polysilicon portion.

10. The power semiconductor device according to claim 8, wherein said metal portion extends along the direction of extension of said gate routing wire.

11. The power semiconductor device according to claim 8, wherein said metal portion and said polysilicon portion are formed to have substantially the same height.

12. The power semiconductor device according to claim 8, wherein said gate routing wire has a portion extending in a direction intersecting the direction of extension of said gate, said portion being commonly connected to said plurality of gates.

13. The power semiconductor device according to claim 8, wherein said metal portion configures a side of said gate routing wire and having a sidewall shape.

14. A power semiconductor device, comprising:
a semiconductor layer:
polysilicon-containing gates:
a first semiconductor region formed in said semiconductor layer at one surface of said semiconductor layer and operative to serve as at least one of a source region and an emitter region;
a second semiconductor region formed in said semiconductor layer at the other surface of said semiconductor layer and operative to serve as at least one of a drain region and a collector region;
a gate routing wire commonly connected to a plurality of said gates and including a polysilicon portion and a metal portion formed adjacent to it in the direction of plane of said semiconductor layer;
an interlayer insulator film formed to cover said first semiconductor region, said gate routing wire and a plurality of said gates;
electrode portions formed in said interlayer insulator film and connected to said first semiconductor region;
a strap electrode plate located to cover said interlayer insulator on said gate routing wire and cover a plurality of said electrode portions and commonly connected to a plurality of said electrode portions,
wherein the bottom of said metal portion and the bottom of said polysilicon portion are located at substantially the same height.

15. The power semiconductor device according to claim 14, wherein said metal portion extends along the direction of extension of said gate routing wire.

16. The power semiconductor device according to claim 14, wherein said metal portion and said polysilicon portion are formed to have substantially the same height.

17. The power semiconductor device according to claim 14, wherein said gate routing wire has a portion extending in a direction intersecting the direction of extension of said gate, said portion being commonly connected to said plurality of gates.

18. The power semiconductor device according to claim 14, wherein said device is a MISFET, in which said first semiconductor region serves as said source region and said second semiconductor region serves as said drain region.

19. The power semiconductor device according to claim 14, wherein said metal portion configures a side of said gate routing wire and having a sidewall shape.

* * * * *